(12) United States Patent
Baxter et al.

(10) Patent No.: US 7,765,089 B2
(45) Date of Patent: Jul. 27, 2010

(54) BLIND SIGNAL SEPARATION

(75) Inventors: Paul Daniel Baxter, Malvern (GB);
John Graham McWhirter, Malvern (GB)

(73) Assignee: Qinetiq Limited (GB)

( * ) Notice: Subject to any disclaimer, the term of this patent is extended or adjusted under 35 U.S.C. 154(b) by 1590 days.

(21) Appl. No.: 10/504,622

(22) PCT Filed: Feb. 14, 2003

(86) PCT No.: PCT/GB03/00655
§ 371 (c)(1),
(2), (4) Date: Aug. 13, 2004

(87) PCT Pub. No.: WO03/073612
PCT Pub. Date: Sep. 4, 2003

(65) Prior Publication Data
US 2005/0105644 A1    May 19, 2005

(30) Foreign Application Priority Data
Feb. 27, 2002    (GB) ................................ 0204548.2

(51) Int. Cl.
H03F 1/00    (2006.01)
(52) U.S. Cl. ..................................... 702/190
(58) Field of Classification Search ............. 702/57, 702/62, 64, 65, 72, 74, 95, 106, 120, 155, 702/183, 189, 190, 196; 345/76, 87, 214, 345/259; 375/316
See application file for complete search history.

(56) References Cited
U.S. PATENT DOCUMENTS 4,727,503 A    2/1988  McWhirter
6,426,977 B1 *  7/2002  Lee et al. ..................... 375/259
6,646,638 B1 * 11/2003  Yeung et al. ................ 345/214
7,050,025 B1 *  5/2006  Yeung et al. ................. 345/87

FOREIGN PATENT DOCUMENTS

WO    WO 99/52211    10/1999
WO    WO 00/25489     5/2000

(Continued)

OTHER PUBLICATIONS

DeLathauer, et a., "An Algebraic Approach to the Blind Identification of Paraunitary Filters", IEEE, pp. 1162-1165 (2000).

(Continued)

*Primary Examiner*—Mohamed Charioui
(74) *Attorney, Agent, or Firm*—McDonnell Boehnen Hulbert & Berghoff LLP

(57) ABSTRACT

A method of blind signal separation of convolutively mixed signals comprises firstly processing signals to produce second order independence. In a second step, and together with ranges of signal delay and rotation parameters, the resulting processed signals are used to determine delay and rotation parameters. These parameters implement at least one elementary paraunitary matrix and transform the processed signals into output signals with improvement in independence to at least a predominant part of a maximum extent obtainable over the parameter ranges. The output signals then become the next processed signals and the second step is iterated until independence ceases to be improved significantly. The latest output signals are then unmixed signals.

30 Claims, 10 Drawing Sheets

FOREIGN PATENT DOCUMENTS

| | | |
|---|---|---|
| WO | WO 01/17109 | 3/2001 |
| WO | WO 02/059772 | 8/2002 |

OTHER PUBLICATIONS

Vaidyanathan, "Mitrate Systems and Filter Banks", XP002249017, pp. 727-729.

Te-Won Lee et al., "A Contextual Blind Separation of Delayed and Convolved Sources", IEEE, pp. 1199-1202 (1997).

Seungjin et al., "Blind Deconvolution of Linear Mimo Systems Driven by Arbitrarily Distributed Sources", IEEE, pp. 662-665 (1999).

Tugnait, "On Blind Separation of Convolutive Mixtures of Independent Linear Signals in Unknown Additive Noise", IEEE Transactions on Signal Processing, vol. 46, No. 11, Nov. 1998, pp. 3117-3123.

Rahbar et al., "Blind Source Separation of Convolved Sources by Joint Approximate Diagnoalization of Cross-Spectral Density Matrices", ICASSP2001, Salt Lake City, May 2001, pp. 2745-2748.

Parra, et al., "Convolutive Blind Separation of Non-Stationary Sources", IEEE Transactions on Speech and Signal Processing, vol. 8, No. 3, May 2000, pp. 320-327.

Sun, et al., "Adaptive Paraunitary Filter Banks for Contrast-Based Multichannel Blind Deconvolution", ICASSP2001, Salt Lake City, May 2011, pp. 2753-2756.

Matsuoka, et al., "A Kurtosis-Based Blind Separation of Sources Using the Cayley Trnasform", AS-SPCC2000, pp. 369-374 Date : (2000).

DeLathauwer, et al., "An Algebraic Approach to Blind MIMO Identification", ICA2000, Helsinki, Finland, Jun. 2000, pp. 211-214.

Cardoso, et al., "Blind Beamforming for Non-Guassain Signals", IEE Proceedings-F, vol. 140,No. 6, Dec. 6, 1993 pp. 362-370.

Belouchrani, et al., "A Blind Source Separation Technique Using Second-Order Statistics", IEEE Transactions on Signal Processing, vol. 45, No. 2, Feb. 1997, pp. 434-443.

Clarke, "Direct Exploitation of Non-Guassianity as a Discriminant", EUSIPCO 1998, Sep. 1998.

Hyvarinen et al., "A Fast Fixed-Point Algorithm for Independent Component Analysis", Neural Computation 9, 1997, pp. 1483-1492.

Akuzawa, "Extended Quasi-Newton Method for the ICA", http://mns.brain.riken.go.jp/~akuzawa/publ/html), pp. 521-525.

Yeredor, "Approximate Joint Diagonalization Using Non-Orthogonal Matrices", Proc ICA 2000, pp. 33-38, Helsinki, Finland Jun. 2000.

Common, "Independent Component Analysis, A new concept", Signal Processing 36, (1994), pp. 287-314.

Hyvarinen, "Complexity Pursuit: Combining NonGaussianity and Autocorrleations for Signal Separation", Neural Computation 9, pp. 175-180, (1997).

Lee et al., "Combining Time-Delayed Decorrelation and ICA: Towards Solving the Cocktail Party Problem", IEEE International Conference on Acoustics, Speech and Signal Processing, May 1998, pp. 1249-1252.

Torkkola, "Blind Separation of Convolved Sources Based on Information Maximization", IEEE Workshop on Neural Networks for Signal Processing, Kyoto, Japan, Sep. 1996, pp. 423-432.

Lee, et al., "Blind Separation of Delayed and Convolved Sources", Advances in Neural Information Processing Systems, 9, 1997, pp. 758-764.

* cited by examiner

BLIND SIGNAL SEPARATION

BACKGROUND OF THE INVENTION (1) Field of the Invention

This invention relates to blind signal separation; more particularly it relates to blind signal separation of signals that have undergone convolutive mixing, and to a method, an apparatus and a computer program for implementing it.

(2) Description of the Art

Blind signal separation is known: it is a form of signal processing implemented by software running on a computer system and accepting data from sensors after conversion from analogue form to digital form. The expression "blind" indicates that no assumptions are made about signal characteristics or processes which form signal mixtures, other than an assumption that signals in a mixture were statistically independent prior to mixing. There are many techniques for separating signals from one another which rely on foreknowledge of signal characteristics. The foreknowledge might be a signal's arrival direction, frequency, waveform, timing, amplitude modulation etc. Blind signal separation however only requires signals to be statistically independent, a realistic hypothesis that usually holds in real scenarios: a set of signals is statistically independent if information about one of its signals cannot be obtained from the others, and information about a sub-set of the signals cannot be derived from knowledge of the values of other signals in the set.

Two further assumptions are normally made in blind signal separation, stationarity and linearity, and these assumptions are also made in connection with the present invention. Stationarity means that signals and channels in which they mix do not change over a time interval during which mixed signals are sampled. Linearity means that mixtures of signals received by sensors are linear combinations of these signals. More complicated combinations featuring signal products and squares and higher order powers of signals are not considered.

The aim of blind signal separation is to recover signals as they were prior to mixing, i.e. original signals. The technique is also known as Independent Component Analysis (ICA), which will be treated as synonymous with blind signal separation for the purposes of this specification. As the objective is to separate mixed signals from one another, blind signal separation is sometimes referred to as "unmixing".

A simple example of an application of blind signal separation involves two loudspeakers transmitting to two receiving microphones. The microphones receive and generate mixtures of signals from both loudspeakers, but the mixtures differ because paths from loudspeakers to receivers are different. In the case of both loudspeakers transmitting speech signals it is difficult or even impossible to make sense of the output of either receiver on its own.

A similar problem may be found in separating co-channel radio signals received by RF receivers, separating machine vibration signals measured by accelerometers or even finding underlying factors in closing stock market prices. In all these situations there may be several signals driving the sensors, or in the last example several varying factors affecting prices.

Statistical independence can be expressed as ability to factorise mixed signals' joint probability density function into a product of the signals' individual probability density functions. The simplest form of blind signal separation problem is referred to as the instantaneous mixing problem: here the propagation delay between each signal and each of a set of sensors can be represented as a simple phase shift applied to the same time samples of that signal.

Many different algorithms for solving the instantaneous mixing problem (hereinafter "instantaneous algorithms") can be found in the literature. Some of the better known instantaneous algorithms are referred to as JADE, SOBI, BLISS and fast ICA, and are as defined in the references below:

"JADE": J F Cardoso and A Souloumiac, "Blind Beamforming for non-Gaussian signals", IEE proceedings-F Vol 140 No 6 December 1993;

"SOBI": A. Belouchrani, K Abed-Meraimm, J Cardoso and E Moulines; "A Blind Source Separation Technique Using Second Order Statistics", IEEE transactions on signal processing, Vol 45 No 2 February 1997;

"BLISS": I. J. Clarke, "Direct Exploitation of Non-Gaussianity as a Discriminant". EUSIPCO 1998, September 1998; and "Fast ICA": A. Hyvarinen, E. Oja, "A Fast Fixed-Point Algorithm for Independent Component Analysis", Neural Computation 9, P1483-1492, 1997

These instantaneous algorithms have a two-stage structure (although that is not essential) comprising a second order decorrelation stage followed by a unitary rotation stage. The second order decorrelation stage is intended to impose second order independence, and the unitary rotation stage is intended to impose higher order independence while leaving second order independence unaffected.

The second order decorrelation stage consists of decorrelating and normalising signals. Decorrelation is the process of removing all correlations or similarities between signal pairs in a set of signals, correlation being defined mathematically as an integral of the product of the signals over time. Normalisation is the process of forcing signals in a set of signals to have the same power level.

The combination of decorrelation and normalisation establishes second order statistical independence. After this, the signals undergo a rotation. In becoming mixed, signals undergo a process (whose effects must be removed to separate them) which is a complicated combination of rotation, stretching and shearing. Decorrelation removes stretching and shearing effects, so that only a rotation needs to be applied to separate the signals. Rotation cannot apply shearing or stretching, and thus cannot counteract decorrelation.

Sometimes it is impossible to find a rotation which is appropriate: e.g. for two mixed signals each having a Gaussian probability density function, second order independence implies total independence. This is because Gaussian distributions do not give rise to dependencies above second order. Thus two independent signals with Gaussian probability density functions have a joint probability density function which has total rotational symmetry, and which in consequence is completely unchanged by rotation through any angle.

The second or higher order stage of prior art instantaneous algorithms therefore searches for a rotation implemented by a unitary matrix that restores higher order independence to the signals.

In one reference (preprint available from http://mns.brain.riken.go.jp/~akuzawa/publ/html), entitled "Extended Quasi-Newton Method for the ICA", T. Akuzawa suggests an algorithm that does not use decorrelation. Instead a gradient descent approach is suggested to minimise a fourth order measure of dependence. A. Yeredor, in "Approximate Joint Diagonalisation using Non-Orthogonal Matrices", Proc ICA2000 p 33-38, Helsinki, Finland June 2000 also avoids decorrelation, but uses a method that minimises a measure based on both second and fourth order dependencies. This allows correlations to be treated the same as fourth order dependencies.

P. Comon, in "Independent Component Analysis, A new concept?" Signal Processing 36 P287-314 1994, discloses a closed form solution using decorrelation. Comon attempts to find the whole unitary matrix at once by repeatedly sweeping through 2 by 2 four-element sub-blocks of the unitary matrix. Its objective is to maximise a fourth order measure of independence. In "Blind Beamforming for non-Gaussian signals", IEE proceedings-F Vol 140 No 6 December 1993, J F Cardoso and A Souloumiac disclose producing an algorithm referred to as "JADE". JADE is similar to Comon's algorithm, but has higher speed from using joint approximate diagonalisation.

Belouchrani et al disclosed modifying the JADE algorithm to produce the SOBI algorithm in "*A Blind Source Separation Technique Using Second Order Statistic*", IEEE transactions on signal processing, Vol 45 No 2 February 1997. The SOBI algorithm only differs from the JADE algorithm in its objective function, which is a second order measure of independence that has to be maximized. It also has the speed advantages of the JADE algorithm from using joint diagonalisation. However SOBI does rely on the signals having different spectral information and can fail if this is not the case.

In "A Fast Fixed-Point Algorithm for Independent Component Analysis", Neural Computation 9 P1483-1492, 1997, A. Hyvarinen, E. Oja disclose an algorithm referred to as the fast ICA algorithm. This algorithm uses signal decorrelation and then attempts implement rotation by building up a unitary matrix one row at a time. To determine the correct rotation, it seeks a maximum in an objective function which is a fourth order measure of independence, or a measure of independence based on non-linearities.

A variant on the fast ICA algorithm has recently been suggested by A. Hyvarinen in "Complexity Pursuit: Combining Nongaussianity and Autocorrelations for Signal Separation", ICA2000 P567-572 Helsinki, Finland June 2000. To determine rotation, it seeks a maximum not of independence but of (Komogoroff) complexity.

In "Direct Exploitation of Non-Gaussianity as a Discriminant". EUSIPCO 1998, September 1998, I. J. Clarke discloses an algorithm referred to as BLISS. This uses signal decorrelation, and then carries out pairwise sweeps as in JADE and SOBI. To determine rotation, BLISS seeks a maximum in an objective function based upon aligning of an estimated joint probability density function with an axis of a coordinate system in which it is plotted: this finds the required rotation explicitly.

Unfortunately, an algorithm which is adequate for the instantaneous mixing problem cannot cope with more difficult problems. These more difficult problems occur when the output of a sensor must be expressed mathematically as a convolution, i.e. a combination of a series of replicas of a signal relatively delayed with respect to one another. It is therefore referred to as the "convolutive mixing" problem.

Blind signal separation of convolutively mixed signals is an area of much current research. Several techniques have been suggested, some of which are successful in some specific set of circumstances. The techniques tend to be slow, require extra assumptions to hold and often have step size/convergence problems.

The approach used in instantaneous algorithms has been extended to the convolutive mixing situation: from this approach it has been inferred that convolutively mixed signals could be unmixed by a two stage algorithm, a first stage imposing second order independence and a second stage imposing higher order independence but not affecting second order independence. This algorithm would accommodate time delays involved in mixing and unmixing. As a first stage, the mixed signals may be transformed by a multichannel lattice filter to obtain decorrelated and whitened signals: in this connection, signal whitening involves forcing a signal to have the same power at all frequencies. Whitening a set of signals means whitening all such signals individually.

Instead of the unitary matrix employed in instantaneous algorithms, the second stage of the convolutive unmixing algorithm employs a paraunitary matrix. As will be described later in more detail, a paraunitary matrix is a polynomial matrix which gives the identity matrix when multiplied by its paraconjugate matrix—a polynomial matrix equivalent of a Hermitian conjugate matrix. A possible approach to the convolutive unmixing problem is therefore to apply a multichannel lattice filter to impose second order independence and whitening, and then to search for a paraunitary matrix that maximises a measure of fourth or higher order independence.

Most prior art convolutive unmixing algorithms do not use a decorrelation procedure. Instead they tend to try to adjust coefficients of unmixing filters using gradient descent or neural network techniques. However some of these algorithms do use decorrelation. They have differing objective functions and differing methods of extracting the paraunitary matrix.

The following three papers disclose applying gradient descent algorithms to maximise entropy of outputs, but without using a full decorrelation step; the first of these papers also suggested using a limited form of decorrelation as a preprocessing step to initialise the method, but did not maintain decorrelation beyond initialisation:

T. Lee, A. Ziehe, R. Orglemeister, T. Sejnowski, "Combining Time-Delayed Decorrelation and ICA: Towards Solving the Cocktail Party Problem", IEEE International Conference on Acoustics, Speech and Signal Processing, 1249-1252, Seattle, May 1998;

K. Torkkola, "Blind Separation of Convolved Sources based on Information Maximisation", IEEE workshop on Neural Networks for Signal Processing, Kyoto, Japan, September 1996; and T. Lee, A. J. Bell, R. H. Lambert, "Blind Separation of Delayed and convolved sources", Advances in Neural Information Processing Systems, 9, 758-764 1997.

A similar algorithm is disclosed by J. K. Tugnait in "On Blind Separation of Convolutive Mixtures of Independent Linear Signals in Unknown Additive Noise", IEEE Transactions on Signal Processing, Vol 46, No 11 November 1998. Here again the decorrelation step is not used, and a gradient descent method is used to adjust estimates of signals and mixing. Objective functions were used which were based upon fourth order measures of independence.

Another similar algorithm is disclosed by K. Rahbar and J. P. Reilly in "Blind Diagonalisation of Convolved Sources by Joint Approximate Diagonalisation of Cross-Spectral Density Matrices". ICASSP2001 Salt Lake City May 2001. A gradient descent method was used to adjust separating filter parameters taken from a frequency domain representation of signal mixing; an objective function used was minimisation of signals' cross-spectral density. This is similar the method suggested by L. Parra and C. Spence in "Convolutive Blind Separation of Non-Stationary Sources", IEEE transactions on Speech and Signal Processing Vol 8 No 3 May 2000. This further method used separation into different frequency components, together with gradient descent and minimisation of an objective function consisting of a cross correlation. It relied on the assumption that signals were non-stationary, but that mixing was stationary.

In "Adaptive Paraunitary Filter Banks for Contrast-Based Multichannel Blind Deconvolution", ICASSP2001 Salt Lake City May 2001, X. Sun and S. C. Douglas disclosed decorrelation followed by finding a paraunitary matrix. After decorrelation the order of the polynomial unmixing matrix being sought was fixed and then looked for by gradient descent. At every step the matrix was forced to be nearly paraunitary. An objective function was used for gradient descent which aimed at maximising fourth order independence.

A similar methodology was disclosed by K. Matsuoka, M. Ohata and T. Tokunari in "A Kurtosis-Based Blind Separation of Sources Using the Cayley Transform", AS-SPCC 2000 This used decorrelation followed by gradient descent for the paraunitary matrix with a fourth order measure of independence as an objective function. It differs to the foregoing in that it used parameterisation based upon the Cayley transform allowing gradient descent in a linear space that was a transformation of paraunitary matrix space.

In "An Algebraic Approach to Blind MIMO Identification", ICA2000 P211-214 Helsinki, Finland June 2000 L. De Lathauwer, B. De Moor and J. Vandewalle; Lathauwer, De Moor and Vandewalle disclose decorrelation together with parameterisation of the paraunitary matrix as disclosed by Vaidyanathan (to be discussed later). The objective was to find a series of delays and rotations of the parameterisation by minimising a fourth order measure of independence based upon the number of blocks still to be found. This relied on the assumption that the order of the paraunitary matrix was known, or guessed correctly in advance.

The last three of the above prior art methods rely on the assumption that there is prior knowledge of the degree of the paraunitary matrix being sought. In practice the degree is guessed, and if wrongly the methods are incapable of correcting for it. If the guess is too large a solution may still be found, but with much unnecessary processing and performance degraded. If the guess is too small the algorithm will simply fail to produce a useful result.

Gradient descent methods that aim to adjust all the parameters of a paraunitary matrix or of an unmixing filter at once have another difficulty: the parameters are linked to any useful measure of independence in a very complex way which does not factorise easily. This means adjusting all parameters at once leading to very slowly converging algorithms.

In "Multirate Systems and Filter Banks", Prentice Hall: Signal Processing Series, 1993, P. P. Vaidyanathan discloses parameterisation of paraunitary matrices in a stage-by-stage decomposition of a paraunitary matrix in $z^{-1}$: here $z^{-1}$ is a delay operator implementing a delay. Vaidyanathan shows that a product matrix built up from a series of pairs of paraunitary matrix blocks is paraunitary: here one block represents a delay and the other a 2 by 2 unitary matrix implementing a Givens rotation (see U.S. Pat. No. 4,727,503). It is proved in Vaidyanathan that a paraunitary matrix of degree N is the product of N+1 rotations and N one-channel delay operators all implementing the same unit delay.

The difficulty with using Vaidyanathan's parameterisation is that the first step in unmixing signals is to look for a rotation to apply, even if one is unnecessary. This superfluous rotation is very difficult for later parameterisation blocks to undo; moreover, it mixes signals to a further degree—e.g. in a two channel case each mixed signal is now a sum of four original signals instead of two. The signals become closer to a Gaussian distribution, and therefore correct rotations are more difficult to find. Thus the superfluous rotation makes the problem more difficult to solve in a way that is difficult to correct. It can lead to failure of the method for even moderately sized problems.

SUMMARY OF THE INVENTION

It is an object of the invention to provide an alternative approach to blind signal separation for convolutively mixed signals.

The present invention provides a method of blind signal separation including obtaining input signals having second order independence with respect to one another, characterised in that it also includes the steps of:— a) processing the input signals with a range of signal delay parameters and a range of signal rotation parameters to determine delay and rotation parameters which implement at least one elementary paraunitary matrix and, transform the input signals into output signals with improvement in a measure of independence; and b) designating the output signals as input signals and iterating step a) until the measure of independence ceases to be improved significantly and then designating the output signals as unmixed signals.

The invention provides a viable technique for blind signal separation of signals which have been convolutively mixed, even if mixed using unknown filters. It is suitable for e.g. signals which have undergone multipath reflection, or acoustic signals in a reverberant environment. It is believed that the method of the invention is more reliable and requires less calculation than any alternative currently known.

To transform the input signals, the method of the invention may employ delay and rotation parameters which characterise a single elementary paraunitary matrix. It may include producing a paraunitary matrix by cumulatively multiplying successive elementary paraunitary matrices produced by iterating step a). The step of processing the input signals may include deriving a polynomial decorrelating matrix and an additional step may be implemented comprising pre-multiplying this matrix by the paraunitary matrix to produce an unmixing matrix.

The range of signal delay parameters may a set of discrete delay vectors, and the delay and rotation parameters may be determined by generating a respective version of the input signals delayed by each delay vector in the set, and for each version finding rotation parameters which at least approach producing maximisation of output signals' independence. The rotation parameters which at least approach producing maximisation of output signals' independence may determined using an algorithm for independent component analysis of the kind used in instantaneous unmixing (instantaneous algorithm).

The method may involve n input signals where n is an integer greater than 2, the range of signal delay parameters being a set of n-element delay vectors and the range of signal rotation parameters being a set of n(n−1)/2 angle parameters. Step a) may comprise determining delay and rotation parameters which implement at least one elementary paraunitary matrix providing for rotation of a pair of input signals and relative delay of the or as the case may be each other input signal. The n input signals may be associated with respective channels, step a) having n(n−1)/2 successive stages each associated with at least one respective elementary paraunitary matrix and each providing for rotation of signals associated with a respective pair of channels and provision of relative delay associated with the or as the case may be each other channel, the first stage being arranged to process the input signals and the or as the case may be each subsequent stage being arranged to receive signals processed in the respective preceding stage.

The method of the invention may involve a set of n input signals where n is an integer greater than 2, characterised in that it comprises:

a) producing n(n−1)/2 replicas of the set of input signals,
b) in each replica selecting a respective signal pair differing to that selected in other replicas, and
c) step a) of being carried out for each replica and comprising
   i) determining delay and rotation parameters which implement at least one elementary paraunitary matrix providing for rotation of the respective selected signal pair only, and
   ii) determining which replica when transformed by the associated at least one elementary paraunitary matrix gives rise to transformed signals corresponding to improvement in a measure of independence by at least a major part of a maximum extent obtainable over the replicas and designating these transformed signals as output signals.

In another aspect, the present invention provides apparatus for blind signal separation comprising computer equipment programmed for reception of input signals having second order independence with respect to one another, characterised in that the computer equipment is also programmed to:— a) process the input signals with a range of signal delay parameters and a range of signal rotation parameters to determine delay and rotation parameters which implement at least one elementary paraunitary matrix and transform the input signals into output signals with improvement in a measure of independence; and
b) designate the output signals as input signals and iteratively process them as aforesaid at a) of this aspect until the measure of independence ceases to be improved significantly and then designate the output signals as unmixed signals.

In a further aspect, the present invention provides a computer programme for blind signal separation of input signals having second order independence with respect to one another, characterised in that it is arranged to control computer equipment to implement the steps of:— a) processing the input signals with a range of signal delay parameters and a range of signal rotation parameters to determine delay and rotation parameters which implement at least one elementary paraunitary matrix and transform the input signals into output signals with improvement in a measure of independence; and
b) designating the output signals as input signals and iterating step a) until the measure of independence ceases to be improved significantly and then designating the output signals as unmixed signals.

The apparatus and computer programme aspects of the invention may include features equivalent to those mentioned above in connection with the method of the invention.

DESCRIPTION OF THE FIGURES

In order that the invention might be more fully understood, an embodiment thereof will now be described, by way of example only, with reference to the accompanying drawings, in which.

DESCRIPTION OF THE INVENTION

Figure 1:
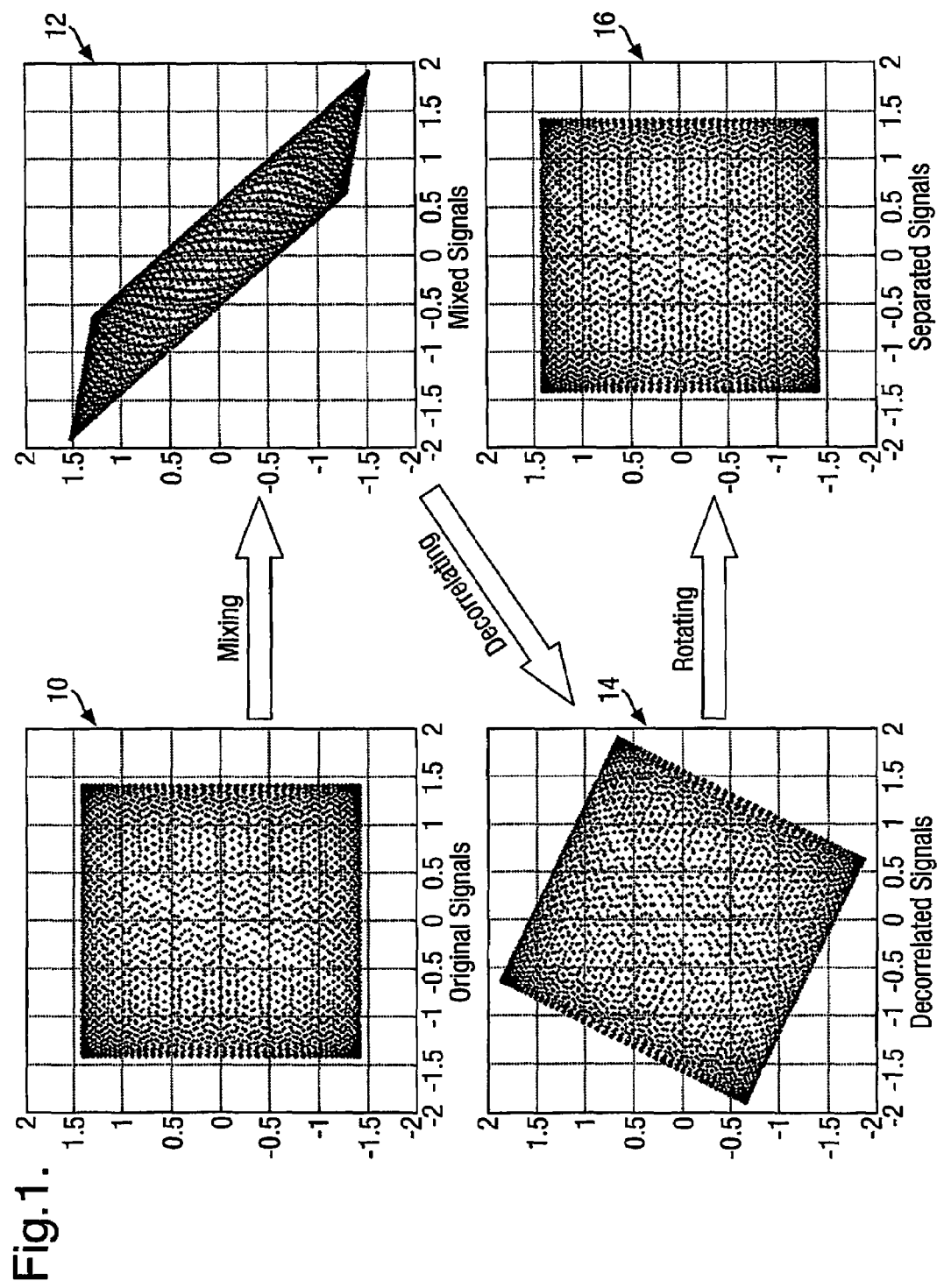
FIG. 1 illustrates stages in a prior art instantaneous unmixing process.

The present invention is arrived at by modifying and extending the prior art of blind signal separation, and this art will first be discussed in more detail to enable the invention to be better understood. As has been mentioned, blind signal separation requires mixed signals to be statistically independent of one another. Independence can be expressed as ability to factorise the signals' joint probability density function into a product of individual signals' density functions. I.e., a joint probability density function $p(x_1, x_2, \ldots, x_n)$ of set of signals $x_1, x_2, \ldots, x_n$ should be factorisable as follows:—

$$p(x_1, x_2, \ldots, x_n) = \prod_{i=1}^{n} p(x_i) \quad (1)$$

where $p(x_i)$ is the probability density function of the ith signal. Unfortunately it is very difficult to determine whether or not this is true for a given set of signals, particularly when only sampled versions of the signals (a series of digital numbers obtained at discrete intervals) are available for analysis. Thus various approximations to independence are used.

It is possible to come up with an infinite number of mathematical expressions that should hold when two signals are statistically independent. However only some of these expressions are suitable for use with sampled signals. One such set of expressions is based on moments of signals. Moments are mathematical functions of signals which are commonly used in the area of Blind Signal Separation. The first, second and third moments define the mean, variance and skewness of the signals. More details appear in Mathematical Statistics and Data Analysis, pages 142-145 John A. Rice, Duxbury Press, second edition.

The equalities at (2) below are suitable for testing with sampled signals, which have moments that are easily estimated. The expressions are:

$$E(x_1 x_2) = E(x_1)E(x_2) \quad (2a)$$

$$E(x_1 x_2 x_3 x_4) = E(x_1)E(x_2)E(x_3)E(x_4) \quad (2b)$$

Here E is the expectation operator, and a product $x_1 \cdot x_2$ represents the signal obtained by multiplying each sample of a signal $x_1$ by a respective sample of a signal $x_2$ having the same sample time.

Expectations can be estimated from sampled signals to determine whether or not Equations (2a) and (2b) hold for sampled signals. If Equation (2a) holds for all signal pairs then the signals are sometimes referred to as 'independent to second order', that being the number of different signals involved in the expression. Similarly, Equation (2b) holding for all possible sub-sets of four signals in the set implies that the signals have fourth order independence.

Mathematically, instantaneous mixing of two signals from sources (e.g. loudspeakers) and their receipt by two receivers can be represented as follows:

$$x_1(t)=h_{11} \cdot s_1(t)+h_{12}s_2(t)$$

$$x_2(t)=h_{21}s_1(t)+h_{22}s_2(t) \quad (3)$$

Here loudspeaker outputs (original signals) reaching the two receivers at time (t) are represented by $\cdot s_1$ (t) and $s_2$ (t): t is in units of an interval between successive digital signal samples (clock cycles), and has integer values 1, 2 etc. The path from each loudspeaker to each receiver and the receiver's reception characteristics give rise to a constant channel modulation. In the instantaneous mixing problem, this modulation is represented by multiplier terms $h_{ij}$, where i=1 or 2 indicates first or second receiver and j=1 or 2 indicates first or second loudspeaker respectively. First and second loudspeaker signals at time (t) are represented by $x_1$ (t) and $x_2$(t). Each receiver signal is the sum of two loudspeaker signals, each multiplied by a respective coefficient. These equations can be represented more compactly in matrix-vector format as:

$$x(t)=Hs(t) \quad (4)$$

where s is a 2 by 1 element vector of two loudspeaker signals, H is a 2 by 2 element mixing matrix and x is a 2 by 1 element vector of two received signals, one at each receiver. H is referred to as the mixing matrix because it has matrix elements or coefficients that operate on the loudspeaker signals and mix them to form the received signals. The sizes of s, x, and H will increase if more than two signals or more than two sensors are involved. As previously mentioned, algorithms for solving the instantaneous mixing problem defined by Equation (4) are known in the prior art.

Referring to FIG. 1, a first signal is shown plotted against a second signal in four graphs: the original signals were sinusoids, such as single tones produced by loudspeakers; each point represents the value of the two signals at a respective time instant (sample time). A first graph 10 shows the original signals before mixing; a second graph 12 shows the same signals after mixing but before processing to unmix them: it shows that mixing corresponds to a complicated combination of stretching, shearing and rotation; a third graph 14 shows the signals after decorrelation and normalisation but before rotation. Decorrelation and normalisation removes stretching and shearing. A fourth graph 16 shows the signals after rotation which restores them to their original form as in graph 10. Graphs 14 and 16 show application of a rotation does not produce shearing or stretching, and thus cannot counteract decorrelation and normalisation.

More mathematically, a correlation matrix R of a set of signals expressed as a vector x can be defined as:

$$R=E((x-E(x))(x-E(x))^H) \quad (5)$$

where E(x) is the expectation of x, that is the mean of x over time and the superscript H means Hermitian conjugate. In Equation (5) E(x) is subtracted from x: this is the first step in all processing that follows. However, to simplify notation it is usually assumed that signals have zero mean values, and this assumption will be used in what follows. This means that Equation (5) simplifies to $R=E(xx^H)$. However, it is not necessary for signals to have zero mean values in order for the invention to be effective.

To impose second order independence upon mixed signals, it is necessary to force the correlation matrix R to have off-diagonal coefficients which are equal to zero. This implies that a correct amount of received signal 1 is subtracted from received signal 2 to insure that the resulting output is decorrelated from received signal 1. This is repeated for all other signals, producing a set of outputs decorrelated with received signal 1, which is then defined as output 1. The remaining set of outputs is then decorrelated with each other by repeating this procedure using them. This is equivalent to obtaining decorrelated signals x' by pre-multiplying signals x by a lower triangular matrix L, i.e. a matrix having all above diagonal coefficients equal to zero. Decorrelated signals are designated x' and have correlation matrix R' defined by:

$$R'=E(x'x'^H)=E(Lxx^HL^H)=I \quad (6)$$

Here the new correlation matrix is shown to be not just diagonal but to be the identity matrix I. This is because it is possible to multiply each signal by a scalar factor without affecting the situation. Thus any correlation matrix with all off-diagonal elements equal to zero and positive numbers on its diagonal can be transformed into the identity matrix I by dividing the signals by the square root of their autocorrelation. This is the normalisation process mentioned above, and it is necessary to ensure that later processing does not counteract the decorrelation step.

After decorrelation, the signals undergo rotation. As shown in FIG. 1 at 14 and 16, the rotation is chosen to align straight edges of the joint probability density function with co-ordinate system axes. Several different rotations can do this: they correspond to permuting the order of outputs and/or multiplying outputs by −1. These differences are not significant.

Mathematically unitary matrices represent rotations, and give the identity matrix when multiplied by their respective Hermitian conjugates. Pre-multiplying decorrelated signals x' by a unitary matrix U to obtain signals x" does not affect a second order decorrelation step. This is shown below, using the linearity of the expectation operator:

$$R''=E(x''x''^H)=E(Ux'x'^HU^H)=UE(x'x'^H)$$
$$U^H=UIU^H=UU^H=I=R' \quad (7)$$

Thus by the unitary property of U the second order stage is left unchanged by the application of U.

Figure 2:
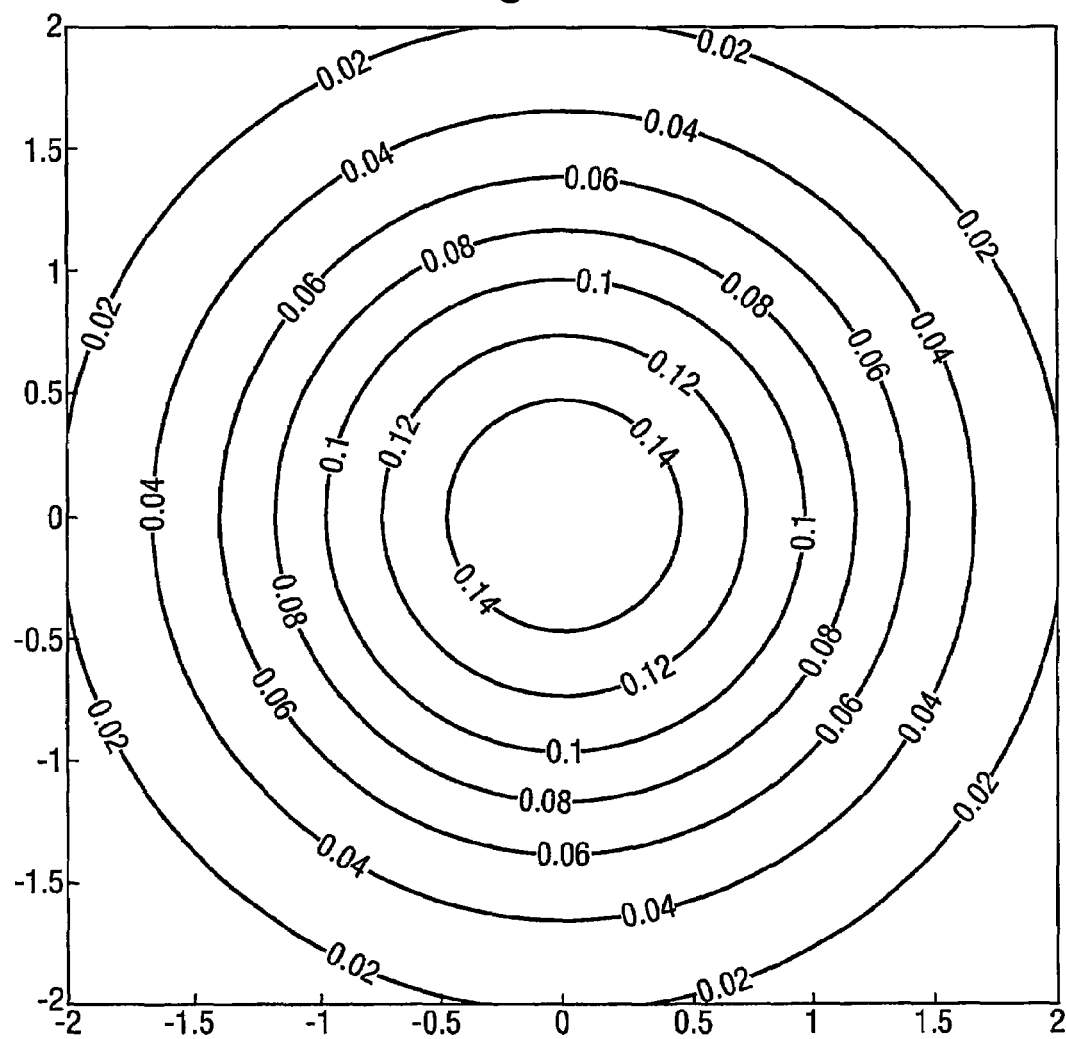
FIG. 2 is a contour plot of a joint probability density function of two Gaussian signals.

Sometimes it is impossible to find the correct U. This is the case if two of the signals each have a Gaussian distribution. In this special case, second order independence implies global independence. FIG. 2 is a contour plot of the joint probability density function of two independent Gaussian distributions: here contour lines show the value of the joint probability density function for different values of each of the two signals. This function has total rotational symmetry and so is unchanged by application of rotation. Rotation will therefore not affect any alignment of this function, and so will neither introduce nor remove dependencies in data used to generate it.

The closer a distribution of signals is to a Gaussian probability density function the harder it is to find a correct rotation. This is because it is harder to detect when signal alignment is correct, and errors will be greater.

Blind signal separation algorithms for the instantaneous mixing problem require that the relative propagation delay between a time sample of a signal from a signal source reaching two separate sensors can be represented as a simple phase shift applied to the signal received by one of the sensors. For N sensors this becomes N−1 phase shifts. If this condition does not hold, the channels from the signal sources to the sensors may be convolutive and the instantaneous algorithms will not work.

One-channel convolution and its analysis using z-transforms will now be considered. In a single signal, single receiver arrangement, the loudspeaker signal consists of a series of values indexed by the respective times t at which they were obtained and denoted by s(t). The loudspeaker signal passes through a channel and is received by the receiver that detects another series of values, x(t). The link between s(t) and x(t) may not be a simple multiplication as in instantaneous mixing. Instead x(t) may consist of a linear sum of several of earlier values of s(t). This is known as a convolution, and is shown by:

$$x(t) = h \otimes s(t) = \sum_{k=0}^{P} h(k)s(t-k) \tag{8}$$

where $\otimes$ is referred to as a "convolution operator". Generation of a linear sum of values of s(t) may occur because signals pass through an irregular channel which spreads them out. It may also occur from multi-path effects, i.e. when there is more than one path a signal can take to reach a receiver and the paths have differing propagation times. Instantaneous mixing is a simple case of convolutive mixing.

Convolution is more complex than and involves more algebra than simple multiplication by a coefficient. However it is possible to reduce it to a multiplication by the use of z-transforms as follows. The z-transforms of s, x and h are:

$$s(z) = s(0) + s(1)z^{-1} + s(2)z^{-2} + s(3)z^{-3} + \ldots$$

$$x(z) = x(0) + x(1)z^{-1} + x(2)z^{-2} + x(3)z^{-3} + \ldots$$

$$h(z) = h(0) + h(1)z^{-1} + h(2)z^{-2} + \ldots + h(p)z^{-P} \tag{9}$$

Here $z^{-1}$ is referred to as a delay operator as mentioned above. The z-transform of a signal expressed as a time series of sample values is a polynomial in $z^{-1}$. Given the form of the z-transform, its polynomial coefficients enable recovery of the original signal. When in their z-transform forms, the convolution of s by h as shown in Equation (5) becomes a multiplication of two polynomials. Thus:

$$x(z) = h(z)s(z) \tag{10}$$

Convolutive mixing may be addressed by combining instantaneous mixing as per Equation (3) with the more complicated approach of Equations (8) to (10). This deals with a plurality of sources and a plurality of receivers with intervening channels which are convolutive. Thus for the two-signal, two-receiver case the following expressions for received signals can be written:

$$x_1(t) = h_{11} \otimes s_1(t) + h_{12} \otimes s_2(t)$$

$$x_2(t) = h_{21} \otimes s_1(t) + h_{22} \otimes s_2(t) \tag{11}$$

In the vector-matrix notation of Equation (4), and using the z-transform notation of Equations (9) and (10), Equation (11) can be written simply as:

$$x(z) = H(z)s(z) \tag{12}$$

Here s(z) is a 2 by 1 coefficient vector formed from z-transforms of loudspeaker outputs. H(z) is a 2 by 2 coefficient polynomial mixing matrix and x(z) is the 2 by 1 vector formed from z-transforms of received signals. Again if more than two loudspeaker and/or receivers are present, the sizes of s(z), x(z) and H(z) increase accordingly.

H(z) is called a polynomial mixing matrix because it represents mixing of signals: its coefficients are polynomials in $z^{-1}$. It may also be considered to be a polynomial in $z^{-1}$ with coefficients which are matrices. It is found one coefficient at a time by taking z-transforms of individual loudspeaker/receiver channels. For future convenience, the order and degree of a polynomial matrix will now be defined. The order of a polynomial matrix is the greatest power to which $z^{-1}$ is raised in the matrix. The degree of a polynomial matrix is the smallest number of delays necessary to implement it as a filter. It is always at least the same size as the order but can easily be greater.

The framework of successful instantaneous algorithms suggests that a convolutive unmixing algorithm should have two stages. A first stage would impose second order independence. A second stage would impose higher order independence while maintaining second order independence. The measure of second order independence has however to operate across time delays. That is, to be independent to second order, the correlation between two signals has to be zero when any time delay is applied to one of the signals. This can be written mathematically as:

$$R(d) = E(x(t)x(t-d^H)) = D(d) \forall d \in (\ldots -2, -1, 0, 1, 2, \ldots) \tag{13}$$

where $\forall d \in (\ldots -2, -1, 0, 1, 2, \ldots)$ means all values of delay d (in units of a time interval between successive signal samples) in the set of all positive and negative whole numbers, and D(d) is a diagonal matrix (all off-diagonal coefficients zero) for all values of d. It is possible to put Equation (13) into z-transform form as follows:

$$R(z) = E(x(z)\tilde{x}(z)) = D(z) \tag{14}$$

where D(z) is a diagonal polynomial matrix. Equation (14) introduces the concept of the paraconjugate $\tilde{x}(z)$ of a polynomial matrix x(z) denoted by a tilde above the matrix symbol $\tilde{x}$. It means the combined operations of transposition and conjugation (as in the Hermitian operator) and the substitution of $1/z^*$ for z. Paraconjugation is the extension of the Hermitian operator to polynomial matrices.

To achieve second order independence it is necessary to force all off-diagonal terms of a polynomial correlation matrix to become the zero polynomial, i.e. the polynomial in $z^{-1}$ with zero as all its coefficients. In addition, the polynomial functions of the matrix on its diagonal are to be the same, so the correlation matrix is equal to a polynomial times the identity matrix. I.e.

$$R'(z) = \begin{bmatrix} \sigma(z) & 0 \\ 0 & \sigma(z) \end{bmatrix} = \sigma(z)I \tag{15}$$

Both decorrelation and forcing of diagonal terms to be the same can be done by one algorithm: this algorithm implements a multichannel lattice filter, of which there are many different variants in the prior art, including square root free forms and different orderings of operations. See e.g. S. Haykin, "*Adaptive Filter Theory*", Prentice Hall, 1991.

Multichannel lattice filters will not be described; as is known they have differing convergence and stability properties enabling those skilled in the art of signal processing to choose among them. However, here for convenience they are all assumed to be acceptably successful and to lead to the same answer.

The unit polynomial is the polynomial that has zero coefficients for all powers of $z^{-1}$ except for $z^0$ which has unity as its coefficient. The multichannel lattice filter ensures that the diagonal terms of the polynomial correlation matrix are the same by forcing them all to be the unit polynomial. This whitens the signals.

The polynomial correlation matrix of the signals $x(z)$ is given by Equation (14) above. The multichannel lattice filter transforms these to obtain the matrix of decorrelated and whitened signals $x'(z)$. These signals have the property that their correlation matrix is the identity polynomial matrix, symbolically:

$$R'(z) = E(x'(z)\tilde{x}'(z)) = I \qquad (16)$$

The extension of the Hermitian operator to the space of polynomial matrices is the operation of paraconjugation. This leads to the definition of paraunitary matrices as those polynomial matrices that give the identity matrix when multiplied by their paraconjugate. Symbolically $H(z)$ is a paraunitary matrix if and only if $H(z)\tilde{H}(z) = \tilde{H}(z)H(z) = I$.

If the application of a paraunitary matrix $H(z)$ to $x'(z)$, the matrix of decorrelated and whitened signals, produces $x''(z)$, the following shows that second order independence is preserved:

$$R''(z) = E(x''(z)\tilde{x}''(z)) = E(H(z)x'(z)\tilde{x}'(z)\tilde{H}(z)) = H(z)E(x'(z)\tilde{x}'(z))\tilde{H}(z) = H(z)I\tilde{H}(z) = H(z)\tilde{H}(z) = I = R'(z) \qquad (17)$$

Once again preservation of second order independence can be seen to follow directly from the defining properties of paraunitary matrices. However whitening is not essential, all that is needed is that the diagonal polynomial correlation matrix be a polynomial factor times the identity matrix. The polynomial factor commutes with all parts of Equation (17) and so is preserved. This shows that a possible approach to the convolutive unmixing problem is to apply a multichannel lattice filter to impose second order independence and whitening, and then to search for a paraunitary polynomial matrix that maximises a measure of the fourth or higher order independence.

Figure 3:
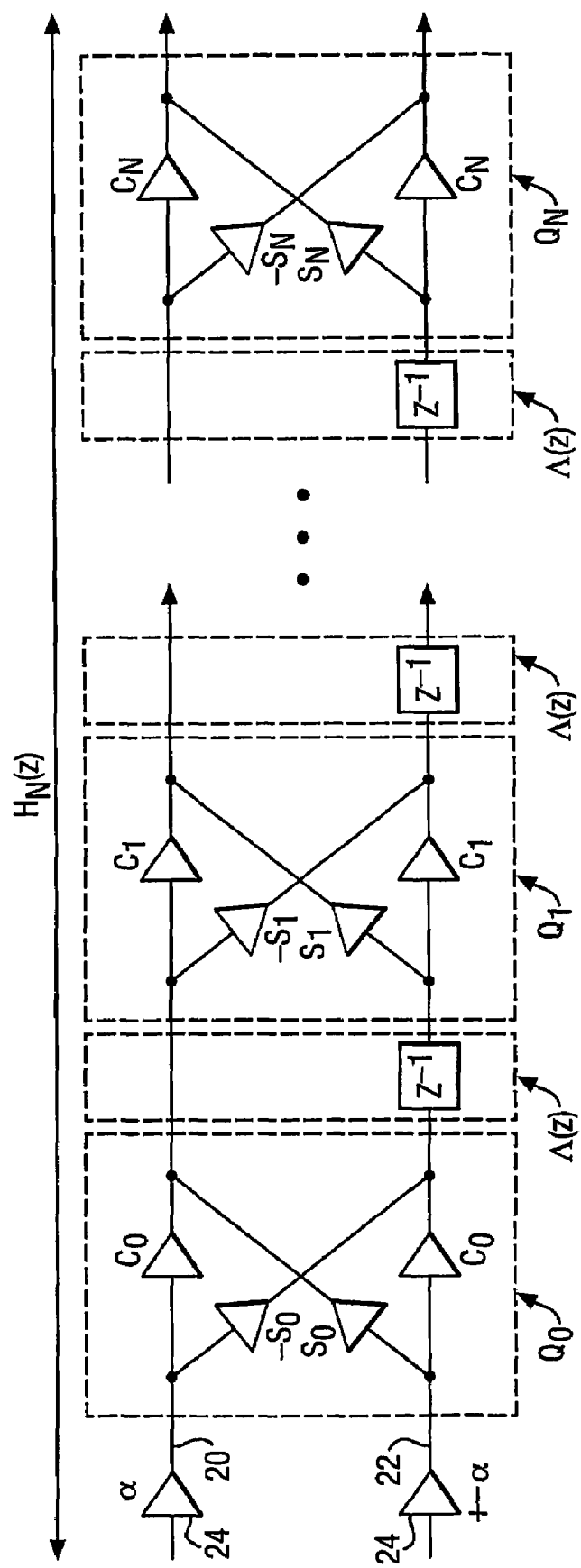
FIG. 3 illustrates decomposition of a paraunitary matrix into degree-one paraunitary matrices in a prior art convolutive unmixing process.

As previously mentioned, the Vaidyanathan reference discloses parameterisation of the space of all paraunitary matrices. This gives a stage-by-stage decomposition of a paraunitary matrix in $z^{-1}$. The parameterisation is illustrated in FIG. 3 for a two-channel case. It comprises a series of N+1 rotation blocks $Q_0, Q_1, \ldots Q_N$, adjacent pairs of these blocks being separated by individual delay blocks $\Lambda(z)$ which are all alike. Upper and lower signal channels 20 and 22 pass through all the blocks. Amplifiers 24 indicate channel input signal scaling factors $\alpha$, of which the upper channel factor is positive and the lower channel factor is positive or negative as indicated by "+−" before "$\alpha$".

Each of the rotation blocks $Q_0$ to $Q_N$ implements a respective 2 by 2 unitary matrix which itself implements a Givens rotation (see U.S. Pat. No. 4,727,503): a Givens rotation is a rotation parameterised by a single rotation angle $\theta$. In the first rotation block $Q_0$, a signal in the lower channel 22 is multiplied by Givens rotation parameters $s_0$ and $c_0$; a signal in the upper channel 20 is multiplied by Givens rotation parameters $-s_0$ and $c_0$; $s_0$ and $c_0$ are respectively the sine and cosine of the rotation angle $\theta$ implemented by the block $Q_0$. Each $c_0$ product is summed with the $s_0$ or $-s_0$ product from the other channel to provide a sum which passes along the respective channel 20 or 22 to the next block $\Lambda(z)$. This next block $\Lambda(z)$ delays the signal in the lower channel 22 with respect to that in the upper channel 20. This procedure is then repeated in subsequent rotation block $Q_1$ to $Q_N$, with equal intervening delays $\Lambda(z)$ in the lower channel 22.

The rotation blocks $Q_0$ to $Q_N$ and delays $\Lambda(z)$ are themselves paraunitary, and so their product is a matrix which is also paraunitary. Vaidyanathan proved that any finite degree N paraunitary matrix can be expressed in this form. Thus apart from a scalar factor, any finite degree paraunitary matrix can be expressed as follows:

$$H_N(z) = Q_N \ldots \Lambda(z)Q_1\Lambda(z)Q_0 \qquad (18)$$

where N is the degree of the paraunitary matrix. Thus a paraunitary matrix $H_N(z)$ of degree N is the product of N+1 Givens rotations and N one-channel delay operators of equal delays, as shown by the concatenated stages in FIG. 3.

However, there is a difficulty with using Vaidyanathan parameterisation, a simple example of which is given here: consider a situation of signals which are an independent identically distributed (iid) time series drawn from some non-Gaussian distribution. To avoid considering the whitening step assume they have been mixed by a paraunitary mixing matrix. Let the paraunitary mixing matrix have degree 1 and be formed, using Vaidyanathan parameterisation, as:

$$H_n(z) = Q_1\Lambda(z)Q_0 \qquad (19)$$

$$= \begin{bmatrix} 1 & 0 \\ 0 & 1 \end{bmatrix} \begin{bmatrix} 1 & 0 \\ 0 & z^{-1} \end{bmatrix} \begin{bmatrix} \cos(\theta_0) & \sin(\theta_0) \\ -\sin(\theta_0) & \cos(\theta_0) \end{bmatrix}$$

i.e. the last of the two Givens rotations is in fact the identity. It has been discovered in accordance with the invention that attempts to undo mixing represented by the matrix $H_N(z)$ should begin by undoing the delay, not by applying a rotation. However, if it is intended to apply a single block type approach, the first step will be to try to find an appropriate rotation to apply, even though one is not needed. This superfluous rotation is very difficult for later blocks to undo, and its application worsens signal mixing. It makes signals closer to a Gaussian distribution, which makes it is more difficult to find correct rotations for them. Thus a superfluous rotation complicates matters in a way that is difficult to resolve.

The present invention is intended to overcome the difficulties indicated above. It is similar to Vaidyanathan's parameterisation but it employs variable delays not necessarily confined to one channel and not necessarily equal; it does not force a rotation to be applied when there is little or nothing to gain, and allows arbitrarily sized paraunitary matrices to be constructed.

Figure 4:
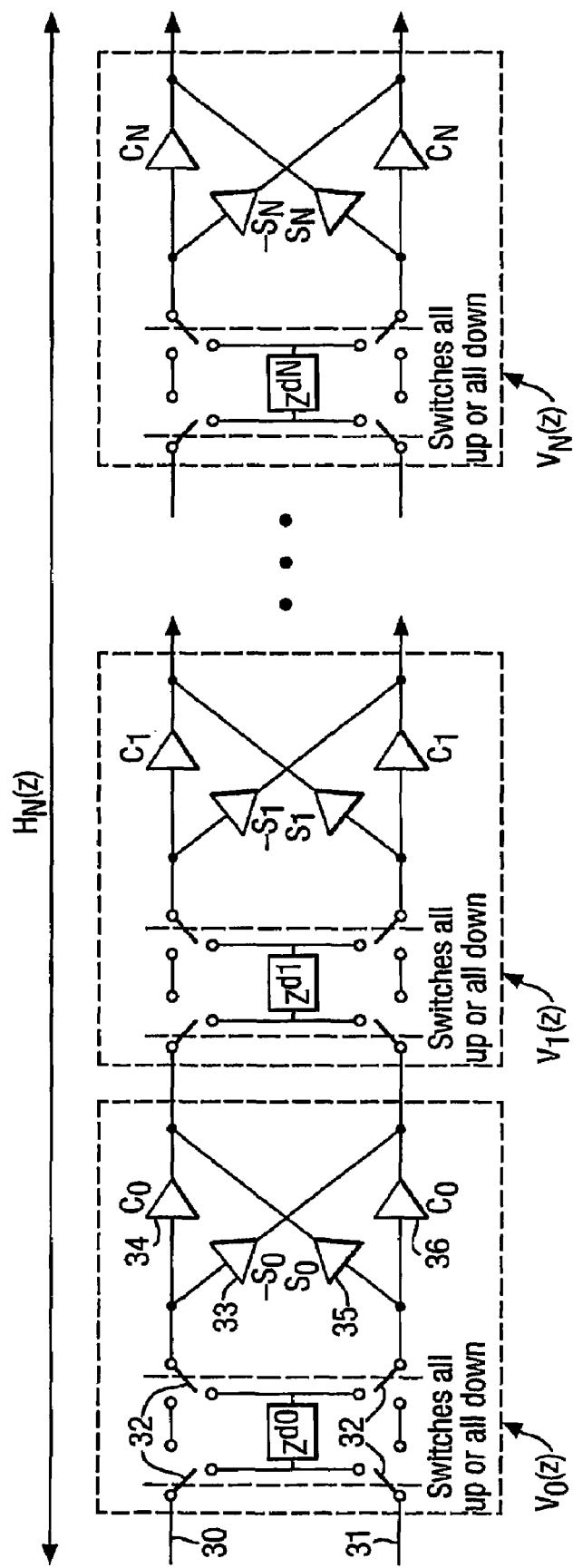
FIG. 4 is a schematic block diagram of decomposition of a paraunitary matrix into elementary paraunitary matrices in a convolutive unmixing process of the invention.

FIG. 4 illustrates the construction of a paraunitary matrix $H_N(z)$ as a product of N+1 elementary paraunitary matrices in accordance with the invention. An elementary paraunitary matrix is an expression coined for the purposes of the present invention: it is defined as a polynomial matrix which represents applying a set of delays to the signals, followed by a single orthogonal transformation (rotation). In FIG. 4 and as in FIG. 3, for the sake of simplicity, only the two-channel case is shown as indicated by upper and lower channels 30 and 31. Each of a set of dotted line blocks $V_i(z)$ (i=0, 1, to N) represents a respective single elementary paraunitary matrix that implements a respective delay $d_i$ followed by a Givens rotation. N+1 of the blocks $V_i(z)$ are used to make up the paraunitary matrix $H_N(z)$.

Each of the blocks $V_0(z)$ to $V_N(z)$ implements a respective 2 by 2 elementary paraunitary matrix which itself implements a Givens rotation. In the first block $V_0(z)$, signals in the upper and lower channels 30 and 31 pass into a matrix of four ganged single pole double throw switches 32 controlling routing or otherwise via a delay cell $Z^{d0}$. The switches 32 are all either in the UP or DOWN positions: when DOWN, upper channel signals are delayed at $Z^{d0}$ but lower channel signals are not, and when UP the reverse is the case. This enables either channel 30 or 31 to be delayed relative to the other.

On leaving the switches 32, an upper channel signal is multiplied by Givens rotation parameters $-s_0$ and $c_0$ at amplifiers 33 and 34 respectively. Similarly, on leaving the switches 32, a lower channel signal is multiplied by Givens rotation parameters $s_0$ and $c_0$ at amplifiers 35 and 36 respectively. Here $s_0$ and $c_0$ are respectively the sine and cosine of a rotation angle $\theta_0$ implemented by the block $V_0(z)$. Each $c_0$ product is summed with the $s_0$ or $-s_0$ product involving the signal from the other channel: this provides sums, which pass along respective channels 30 and 31 to the next block $V_1(z)$. This delay/rotate procedure is then repeated in subsequent blocks $V_1(z)$ to $V_N(z)$. These later blocks will not be described further because they operate in the same way as the first block $V_0(z)$, except their delays and rotations will usually be different. Implementation of this procedure to find appropriate delays and rotations will be described later, following a theoretical discussion.

A full paraunitary matrix parameterisation in accordance with the invention in terms of elementary paraunitary matrices can be expressed as follows:

$$H_N(z) = V_{d_N, \theta_N}(z) \ldots V_{d_1, \theta_1}(z) V_{d_0, \theta_0}(z) \quad (20)$$

The progress of unmixing in accordance with the invention uses a cost function that is calculated after every application of an elementary paraunitary matrix to the data to determine whether or not an improvement has been achieved. The cost function is a measure of the independence of the signals, an example of which is a fourth order measure of non-Gaussianity, and is at a maximum when fourth order measures of dependence are at a minimum. Thus increasing this cost function value will remove dependencies between the signals.

The cost function used in the present example is a measure of the departure of a sampled distribution from a Gaussian distribution: here a sampled distribution is an estimate of signals' probability density function produced from observed signals. The Central Limit Theorem indicates that mixing signals will tend to increase their Gaussianity, unmixing the signals should increase a measure of their non-Gaussianity. Thus the cost function should be increased if only partial unmixing is done, which is beneficial because it allows the effect of each successive elementary paraunitary matrix to be tested. This contrasts with some measures of independence that are insensitive to all but the last step of the unmixing.

This cost function will be used to find which of a range of delays gives the best results in successive elementary paraunitary matrices. It will be referred to as the Independence Cost Function (ICF).

The process of the invention takes in signals and first passes them through a multi-channel lattice filter to decorrelate and whiten them giving second order independence. The next stage is to find an appropriate paraunitary unmixing matrix. This matrix is not parameterised as disclosed by Vaidyanathan, but it is instead parameterised in terms of elementary paraunitary matrices (see Equation (20)) calculated sequentially. Once derived, each elementary paraunitary matrix is applied to the signals used to calculate it: this transforms the signals into a form suitable for calculating the next such matrix.

To calculate an elementary paraunitary matrix a set of possible delays is considered. A latest elementary paraunitary matrix is chosen which maximises the ICF calculated for signals transformed by application of all such matrices calculated up and including the l(test. To identify the latest elementary paraunitary matrix its delay and rotation have to be specified. There is a countable infinity of different possible delays, but an uncountable number of different rotation parameters. Realistically the countable infinity of possible delays will be reduced to a finite number of different delays to be considered.

Once a trial value of delay has been applied to the signals, rotation parameters $s_0$ and $c_0$ are chosen. These parameters could be chosen by using a technique which explicitly maximises the ICF of output signals. However it is quicker to use a prior art instantaneous algorithm: these algorithms are designed to unmix instantaneously mixed signals and should produce parameter values that nearly maximise the ICF of the outputs. If an ICF is chosen which is far from the most appropriate having regard to the choice of instantaneous algorithm, then the ICF may not be greatly improved by the algorithm. Choosing an ICF which is similar in form to that of the instantaneous algorithm avoids this problem.

It is therefore possible to look at a range of trial delays and for each delay to attach the rotation that maximised the ICF after the application of the delay and the rotation. This produces a set of possible elementary paraunitary matrices, each associated with a respective ICF found by applying it to signals and finding the ICF of the resulting output. The elementary paraunitary matrix that is selected is that having the best ICF output. This stage is repeated until there is no gain in ICF to be found.

This stage of the process of the invention can be seen as sequentially applying a series of elementary paraunitary matrices each chosen to maximise an ICF measure in an output resulting from its use. Each elementary paraunitary matrix contains one rotation. Thus the process of the invention implements an algorithm referred to as the Sequential Best Rotation (SBR) algorithm. This algorithm comprises decomposition of the paraunitary matrix into elementary paraunitary matrices, and the use of a measure which can be meaningfully calculated at each stage of the algorithm not just at the end. The combination of these two steps separates the algorithm into a series of like stages that can be carried out in sequence.

Figure 5:
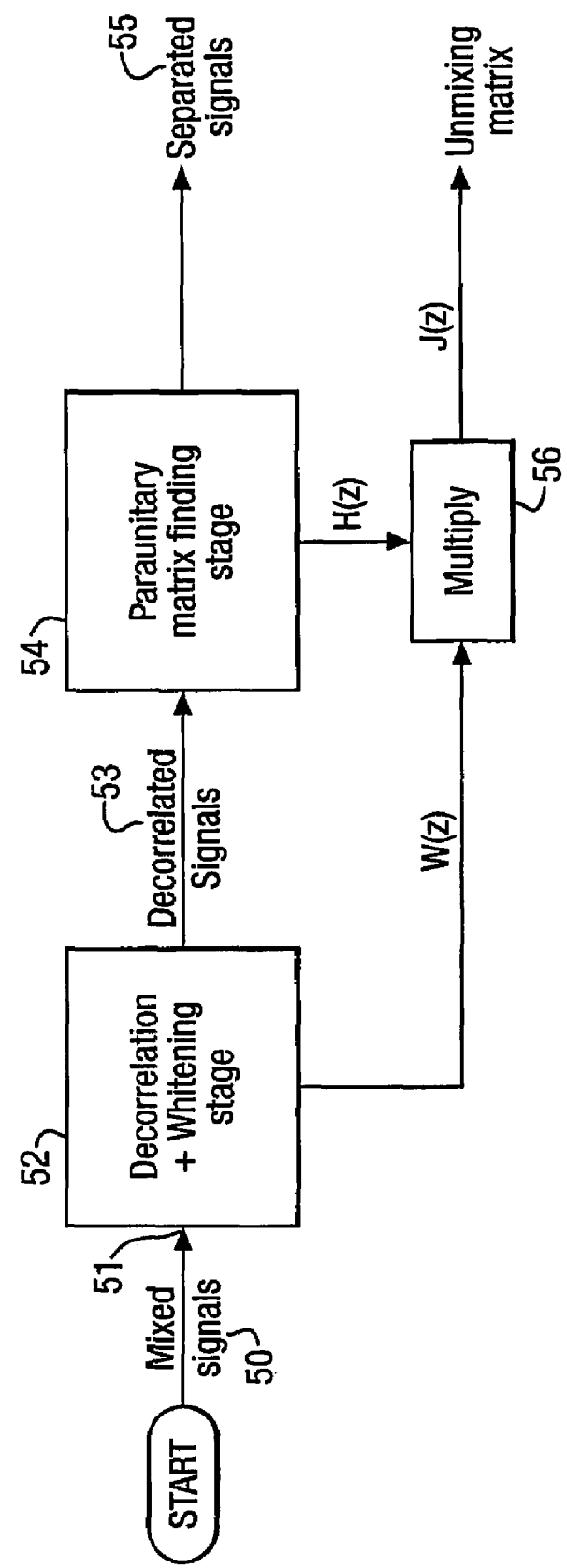
FIG. 5 is a schematic block diagram of a convolutive unmixing process of the invention.

Referring now to FIG. 5, a flow diagram of the general aspects of the process of the invention is shown. Mixed signals 50 are applied to an input 51 of a prior art multi-channel lattice linear prediction filter 52, which decorrelates the signals across a wide range of delays and whitens them. The filter 52 is of a kind well known in the prior art and described inter alia by S. Haykin in "Adaptive Filter Theory", Prentice Hall, 1991. It will not be described in detail. It both imposes second order independence and ensures this independence will not be removed from decorrelated signals by subsequent application of a paraunitary matrix to them. In this process the filter 52 derives a polynomial decorrelating matrix W(z). Decorrelated signals 53 produced by the filter 52 pass to a matrix finding stage 54: here a polynomial paraunitary matrix H(z) is derived and applied to the decorrelated signals to produce the required separated signals 55 having fourth order independence. The matrix finding stage 54 also outputs the matrix H(z), which together with W(z) passes to a multiplier 56. The multiplier 56 pre-multiplies W(z) by H(z) to give an unmixing matrix J(z) representing the transformation of the mixed signals 50 into separated signals 55.

It is not essential to generate the unmixing matrix J(z), but it permits the process to be tested: I.e. mixed signals 50 which have undergone a prearranged form of convolutive mixing can be used to produce J(z), and then J(z) can be compared with the prearranged form to see how faithfully the former reconstructs the latter. Moreover, it can be shown that under certain circumstances J(z) can be used to determine further information about the original signals, such as arrival direction and frequency.

Figure 6:
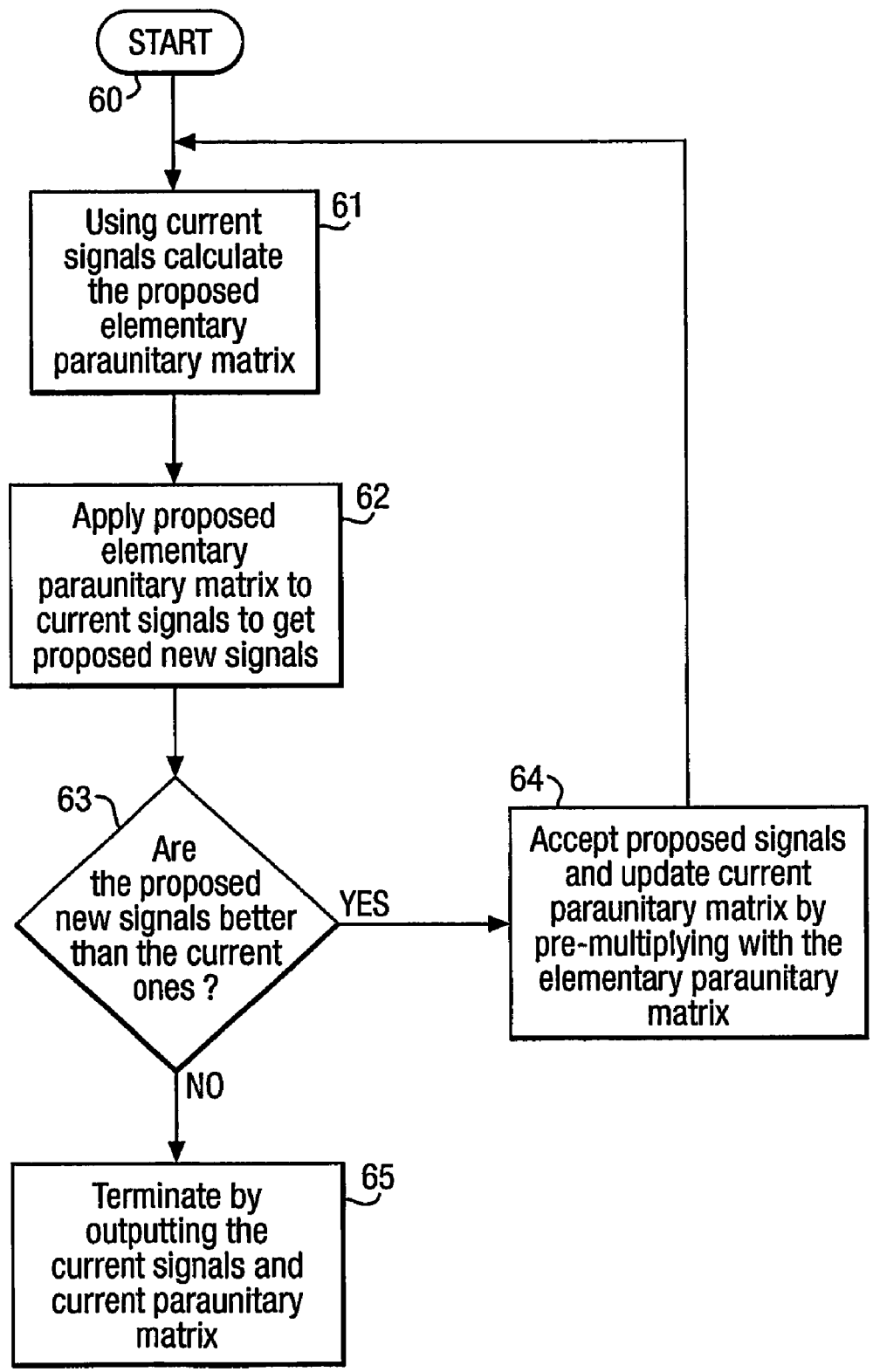
FIG. 6 is a schematic block diagram illustrating production of a paraunitary matrix from elementary paraunitary matrices in a process of the invention.

Referring now to FIG. 6, a flow diagram is shown illustrating an iterative process of the invention to produce a paraunitary polynomial matrix H(z) as the product of a series of elementary paraunitary matrices. At the beginning of each successive iteration of the process there is a respective current value h(z) of the evolving paraunitary matrix, i.e. the product of all elementary paraunitary matrices calculated up to the present time. There is also a set of current signals derived using the most recently calculated elementary paraunitary matrix incorporated in h(z): h(z) represents the transformation which converts the original input mixed signals (50 in, FIG. 5) to obtain the current signals: it is improved repeatedly until applying a further elementary paraunitary matrix results in no improvement In ICF, at which point h(z) has become H(z).

The process starts at 60, where the initial current signals are the original input signals at 53 which are decorrelated and whitened, and the initial current value of the paraunitary matrix h(z) is the identity matrix I. At 61 the current signals are used to produce a current elementary paraunitary matrix; at 62 this matrix is applied to the current signals to produce new signals. At 63 the new signals are tested to see whether their statistical independence properties have improved: if such an improvement has been obtained, at 64 the current elementary paraunitary matrix is used to pre-multiply h(z) to provide the latest current value of the evolving paraunitary matrix and the new signals become the latest current signals. The latest current value of h(z) and the latest current signals are then fed back to stage 61 for the procedure of stages 61, 62 and 63 to be repeated.

If at 63 the new signals show no improvement over the current signals has been obtained, the process is considered to have converged to a solution and terminates at 65: the current value of h(z) is output as H(z) and the current signals are output as the required separated signals. Thus the use of elementary paraunitary matrices divides the problem of separating signals and obtaining H(z) into a number of sub-problems.

Methods for finding each elementary paraunitary matrix at 61 and for deciding at 63 whether or not the new signals are improvements over the current signals will now be described. The first relies upon the signals being non-Gaussian so that, as previously mentioned, instantaneous algorithms can work. The second relies upon a measure of the independence of the signals being used. An accurate and comprehensive independence cost function (ICF) is impossible to calculate from sampled signals, but it is possible to calculate various different partial measures of independence An example of a good independence cost function will now be given. It is based upon the fourth order kurtosis terms $\kappa(x_1, x_2, x_3, x_4)$ of a set of signals defined by:

$$\kappa(x_1,x_2,x_3,x_4)=E[x_1x_2x_3x_4]-E[x_1x_2]E[x_3x_4]-E[x_1x_3]E[x_2x_4]-E[x_1x_4]E[x_2x_3] \quad (21)$$

where E is the expectation operator and $x_1$, $x_2$, $x_3$ and $x_4$ are signals in the set: they may be different signals, or the same signals, and they may have delays applied to them.

The independence cost function, denoted by $K_1^r$, is defined as the sum squared of all the possible kurtoses in the set of signals: here firstly $x_1$, $x_2$, $x_3$ and $x_4$ are all the same signal and secondly the maximum delay applied to any of them is r. The maximum delay r can be regarded as an indication of the locality of the cost function. If r=0 the cost function is referred to as a pointwise cost function, if r is small, i.e. r<5, the cost function is referred to as a local cost function, otherwise it is a wide cost function.

The greater the r value the more informative $K_1^r$ is. For this reason it would be useful to use a wide cost function. However as r increases the amount of effort required to calculate $K_1^r$ grows exponentially. Thus it is sensible to use a local $K_1^r$, or even its pointwise form. The process of the invention may use any convenient ICF, provided it is an accurate ICF and is used consistently throughout.

At 63 current signals and new signals are compared by calculating their ICFs: the signals having the higher ICF are accepted as being the better of the two.

To obtain the latest elementary paraunitary matrix at 61, it is necessary to derive two parameters, which characterise such a matrix, a delay parameter d and a rotation parameter $\theta$. Thus identification of the paraunitary matrix reduces to finding $(d,\theta)$. The parameter d is a vector parameter, and $\theta$ can be a vector parameter if there are more than two signals. However in this example only the case of two signals is being considered, thus $\theta$ is not a vector.

To find the delay parameter d, a set D of possible values for it is selected. A suitable set for the two-signal case is shown below in Equation (22), i.e. D may be represented as:

$$D = \left\{ \binom{0}{A}, \binom{0}{A-1}, \ldots, \binom{0}{1}, \binom{0}{0}, \binom{1}{0}, \ldots, \binom{A-1}{0}, \binom{A}{0} \right\} \quad (22)$$

where dots indicate terms not shown, each inner pair of parentheses represents a delay vector $\delta_i$ having two elements, 0 in an upper or lower position in parentheses indicates an undelayed upper or lower signal channel respectively, and a non-zero value in such a position indicates a delayed channel located likewise: each non-zero value represents delaying the associated channel in each case relative to the other channel by an integer value not greater than A. Delays are in units of a time interval $\tau$ between successive signal samples, e.g. a delay (A−1) implies (A−1)$\tau$. There are also other possibilities for D, but before major departures from this scheme are implemented they should be assessed for validity. The number of elements or delay values in D is S., i.e. |D|=S.

Figure 7:
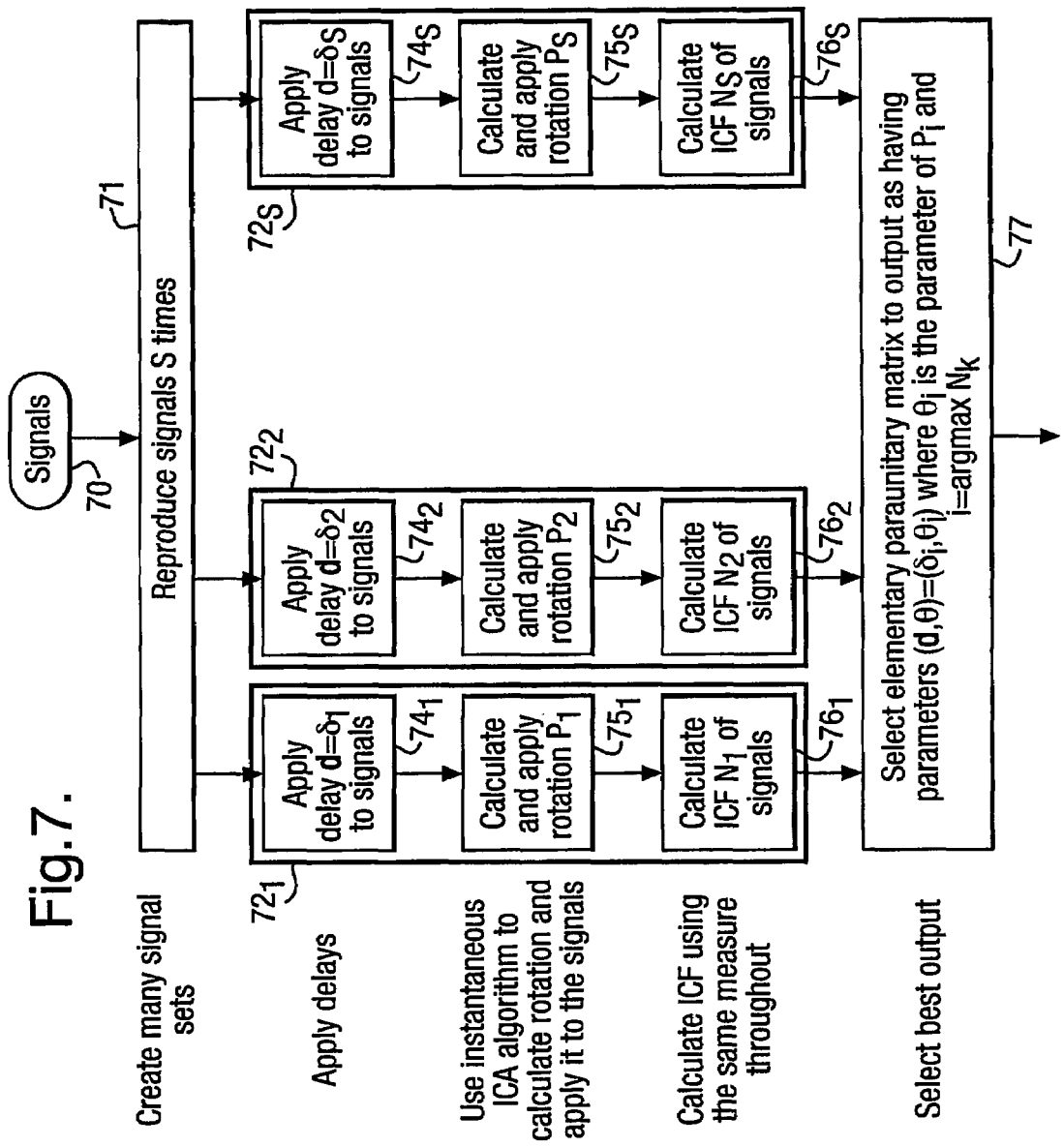
FIG. 7 illustrates production of elementary paraunitary matrices in a process of the invention.

Referring now to FIG. 7, there is shown a flow diagram indicating how elementary paraunitary matrices are found. For all delay vectors $\delta_1$ to $\delta_s$ in D, respective elementary paraunitary matrices are derived, and then the ICFs of the signals these matrices create are calculated. The elementary paraunitary matrix corresponding to the best ICF is then selected for use. In the drawing, in the two-channel case a pair of current signals are input at 70. At 71 the signals are replicated S times, i.e. as many times as there are delay values in D. In the two channel case each replica is a pair of current signals: each replica pair is input to a respective signal channel 72$_i$ of which there are S, i.e. i=1 to S. Three channels are shown, 72$_1$, 72$_2$ and 72$_S$, others being implied by chain lines such as 73. At 74$_1$ to 74$_S$, each of the channels 72$_1$ to 72$_S$ applies a respective delay vector $\delta_1$, ... $\delta_S$ from D to its replica, i.e. it delays one of the pair of current signals in its replica relative to the other: the ith channel 72$_i$ applies delay vector $\delta_i$ to the ith replica, and i=1 to S. In each of the channels $72_1$ to $72_S$ the relative delay produces a pair of signals that are different from those input at 70, although they are no more independent than before. To make these signals as independent as possible in a pointwise sense using only a rotation is exactly what is carried out in instantaneous unmixing. Thus the application of any of the successful prior art instantaneous algorithms for ICA previously discussed provides a suitable rotation. This is well known and will not be described: it is implemented at $75_1$ to $75_S$ as rotation operations $P_1$ to $P_S$ giving rotation angles $\theta_1$ to $\theta_S$ respectively.

Each channel $72_i$ now has parameters associated with it consisting of a delay vector $\delta_i$ and a rotation angle $\theta_i$, just as if an elementary paraunitary matrix implementing those parameters had been applied to the signals input at 70: moreover, when applied to input signals this matrix provides a rotation which produces output signals that are as independent as they can be for the relevant value of delay element $\delta_i$. The first two elements $74_i$ and $75_i$ of each channel $72_i$ therefore in combination simulate an elementary paraunitary matrix with a respective parameter set $(d, \theta)=(\delta_i, \theta_i)$.

The next stage is to determine which of the channels $72_1$ to $72_S$ simulates an elementary paraunitary matrix producing the highest improvement in independence. This is carried out at $76_1$ to $76_S$, where ICFs of signals output from stages $75_1$ to $75_S$ respectively are calculated. These ICFs are compared with one another at 77, and whichever channel produces the greatest ICF provides the highest improvement in independence and simulates the best elementary paraunitary matrix: this matrix is selected as the output of the process indicated in FIG. 7 for use at 61 in FIG. 6.

It is not in fact essential to choose whichever channel produces the greatest ICF: another channel giving a value relatively close to this value would be acceptable. Also a channel might be selected to give a more convenient value for one of the parameters, e.g. a shorter delay. If however a channel is chosen giving a value insufficiently close to the greatest ICF, then the process of signal separation may fail because it might be impossible to rectify matters in subsequent iterations. So a channel should be selected which gives an ICF or improvement in independence to at least a predominant part of the maximum of these obtainable over the ranges of delay and rotation parameters.

The foregoing embodiment of the invention related to a two-channel case, i.e. two signal sources, two receivers and two paths from each source to receivers. If there are more than two channels further processing is necessary. However the procedure of the invention in general terms remains the same: i.e. process the signals to achieve second order independence, and then find a paraunitary matrix to separate them, the matrix being a product of successive elementary paraunitary matrices each of which maximises a measure of independence of outputs resulting from its application to input signals.

There are several ways of extending the invention to more than two channels. One is a simple, direct extension of the previous embodiment. Others use a methodology of some prior art instantaneous algorithms, i.e. use signal pairs, attempt to impose pairwise independence, and sweep through all signal pairs in some order.

Figure 8:
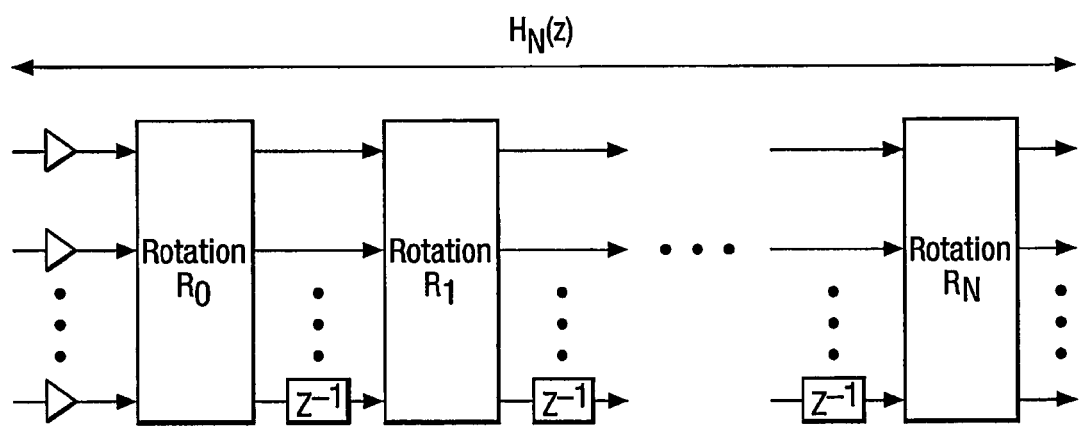
FIG. 8 illustrates decomposition of a paraunitary matrix into elementary paraunitary matrices in a prior art convolutive unmixing process involving more than two signal channels.

FIG. 8 shows the decomposition of a paraunitary matrix with degree N for the multi-channel case (i.e. three or more channels) as given by the Vaidyanathan prior art previously mentioned. It is very similar to the two-channel case of FIG. 3. The difference is that Givens rotations, which are essentially two-channel operators, have been replaced with more general rotations operating on all channels at once. This can be expressed mathematically as:

$$H_N(z) = R_N \ldots \Lambda(z) R_1 \Lambda(z) R_0 \quad (23)$$

where as before $\Lambda(z)$ is a matrix representing successive unit delays in the lowermost channel, and $R_i$ (i=0 to N) represents the ith rotation. In the n channel case each rotation has $n(n-1)/2$ parameters, which reduces to one parameter when n=2 for Givens rotations used in the two-channel case.

The parameterisation of Equation (23) involves the same problems as in the two-channel case described with reference to FIG. 3. Here again the procedure used to deal with the problems is the decomposition of a paraunitary matrix into elementary paraunitary matrices: the elementary paraunitary matrices are found by considering the decomposition and constraining all but the last rotation. The last rotation is unconstrained, but all others are constrained to either leave inputs unchanged or to reorder channels so a different channel receives a subsequent delay. Thus all rotations apart from the last are constrained to be permutations. The elementary paraunitary matrix can thus be expressed as:

$$V_{d,\theta}(z) = R_\theta \Lambda(z) \ldots P_1 \Lambda(z) P_0 = R_\theta D_d(z) \quad (24)$$

Here $P_i$ is the ith permutation matrix and $R_\theta$ is the rotation matrix parameterised by a vector of $n(n-1)/2$ rotation angles $\theta$. The combination of all permutation matrices and delay matrices is denoted by $D_d$, which is referred to as the delay matrix. Its index, d, is a length n vector whose n elements are delays applied in respective channels.

Equation (24) shows the extended form of an elementary paraunitary matrix. First a delay matrix is applied, which consists of differing delays being applied in all the channels. Secondly a rotation is applied. As before this is a good choice for an elementary building block, as it contains only one operation that mixes the signals. However, this form is parameterisable, the parameters being the vectors d and $\theta$. This means that the decomposition of a paraunitary matrix Into elementary paraunitary matrices can be written as:

$$H(z) = V_{d_N,\theta_N}(z) \ldots V_{d_1,\theta_1}(z) V_{d_0,\theta_0}(z) \quad (25)$$

The methodology for finding this expansion is largely the same as in the two-channel case. It only requires modification in selecting D, the delay set or set of possible delays for forming the first stage of the elementary paraunitary matrices. In the two-channel case the elements of D were treated as delays applied to only one channel. In the more general case delays are allowed in more than one channel. As in the two-channel case there is a countable infinity of possibilities, so a sensible finite set has to be selected to form D.

The number of elements in D could be fixed by setting an upper limit denoted by l to the number of delays in it. Thus D can consist of all possible ways of allocating up to l delays between n channels. Applying the same delay to all channels at the same time is equivalent to applying no delay at all, so all elements in D should have at least one channel that is not delayed. The number of elements in D can grow very fast as n and l increase. As before this scheme for D is merely selection of a sensible option. Other possibilities exist but usually need more justification to ensure validity. It is possible to justify some choices (such as allowing delays to be applied to only one channel) by saying they allow a higher l for a fixed size of D. Thus they allow the algorithm to consider longer delays, at the cost of not allowing it to implement more complicated combinations of smaller delays.

However it is defined, once D is fixed the process of the invention can proceed in the multi-channel case similarly to the two-channel case of the previous embodiment. There are two differences: firstly, the two-element delay vectors $\delta_i$ in FIG. 7 are replaced by delay vectors (elements of the delay set D) having n elements, where n is the number of channels. This allows the algorithm to apply an element of D to the signals. Secondly, the rotations calculated by known instantaneous algorithms at stages $75_1$ to $75_S$ are now n channel rotations. These can be obtained by successively applying n(n−1)/2 two channel rotations, and so can be parameterised by n(n−1)/2 angle parameters: Prior art instantaneous algorithms previously mentioned provide current signals and a rotation matrix which generates them, so the process will not be described further.

This approach to the multi-channel case may give difficulty over the size of the delay set D: because each element in D is a vector, for each element a whole n by n instantaneous algorithm has to be carried out. As the delay set upper limit l grows this becomes the dominant time constraint and slows processing down. So-called "sweeping" algorithms were developed in the prior art to attempt to mitigate similar problems in the instantaneous case, and in other algorithms such as the singular value decomposition algorithm.

In "Independent Component Analysis, A New Concept?" Signal Processing 36 pp 287-314 1994, P. Comon showed that imposing pairwise independence is equivalent to imposing total independence under very mild conditions. Unfortunately when imposing pairwise independence upon any two signals the pairwise independence of other signals will be affected. Despite this, it has been shown that cycling through different signal pairings and imposing pairwise independence leads to good signal separation provided that there are repeated sweeps through all available signal pairs. The BLISS algorithm, the JADE algorithm and others previously mentioned use this technique for finding a unitary rotation matrix. They only work on making two signals pairwise independent of each other.

The procedure of the invention for finding an elementary paraunitary matrix algorithm that follows the same approach as the BLISS algorithm is called the sweeping process. It has a prearranged ordering of all available signal pairings through which it works in a sweep. Each signal pair is processed using the two-channel process of the first embodiment of the invention. The remaining signals are aligned in time (delayed) so they have at least approximately the same delay applied to them as the signal pair being processed. At the end of a sweep the same termination condition from the previous embodiment of the invention can be applied to decide if another sweep needs to be carried out or if no more significant improvement is obtainable.

Figure 9:
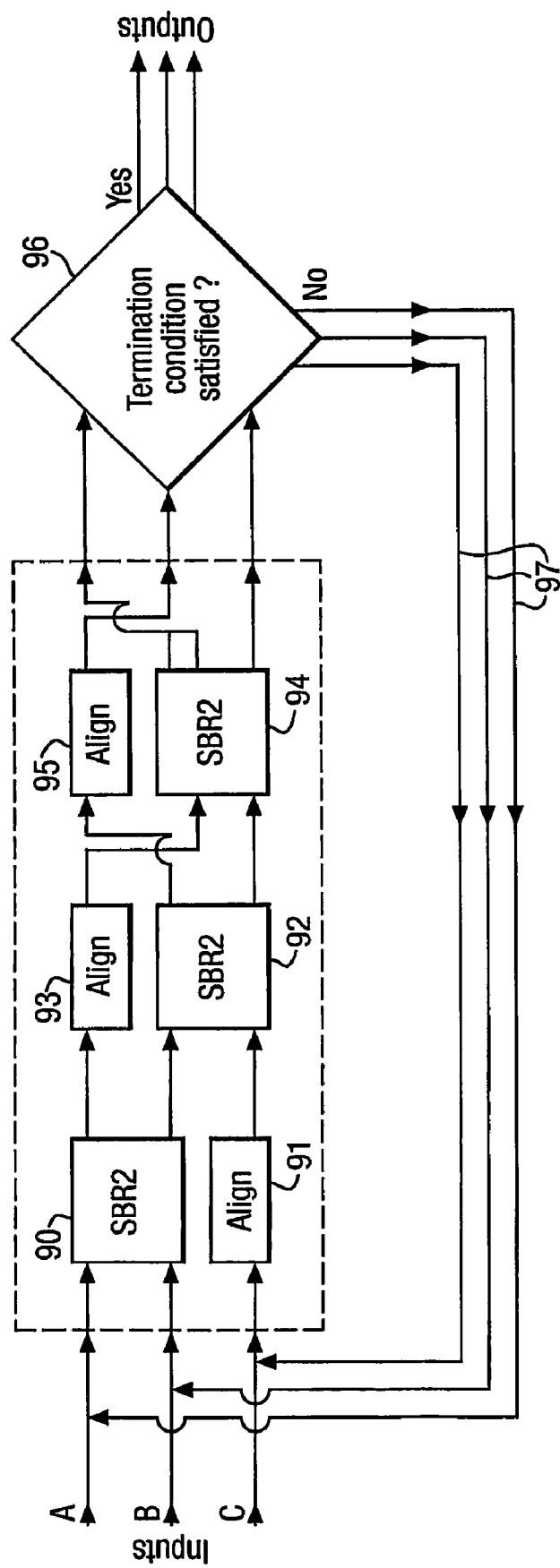
FIGS. 9 and 10 schematically illustrate alternative convolutive unmixing processes of the invention involving more than two signal channels.

FIG. 9 illustrates the procedure for three signals A, B and C. As mentioned earlier the process of the invention implements the sequential Best Rotation or SBR algorithm. In the drawing, "SBR2" indicates application of the SBR algorithm for a two-channel case as in the previous embodiment.

In an initial phase, signals A and B are processed with SBR2 at 90, and at 91 signal C is aligned in time for substantial synchronisation with the output from 90. Time alignment at 91 is carried out by delaying C by half the order of the polynomial matrix determined at 90—i.e. C is delayed in time by half the sum total of the delays applied in the processing of A and B irrespective of which channel the or (as the case may be) each delay lies in. Alignment of C in this way is not essential but has been found to give acceptable results. It is not necessary to allow for processing delay to implement SBR2 at 90, because the signals A, B and C are sequences of digital data samples stored when not in use: "delaying" C relative to A or B merely means changing the sample number in a sequence input to a subsequent processing stage.

At stages 90 and 91 in combination, at least one elementary paraunitary matrix is applied to all three signals: such a matrix can be generated by extending the or as the case may be each two channel elementary paraunitary matrix produced at 90 to cover three channels. The or each matrix applies rotation and delay to signals A and B but it applies a delay to signal C without rotating it. If more than one elementary paraunitary matrix is determined at 90, all delays applied to signal C must add up to the total delay applied to C at 91.

In a second phase, signal B (after processing at 90) and signal C (after delay at 91) are processed with SBR2 at 92, and signal A (after processing at 90) is aligned in time at 93 with the output from 92. In a third phase, signal A (after alignment at 93) and signal C (after processing at 92) are processed with SBR2 at 94, and signal B (after processing at 92) is aligned in time at 95 with the output from 94.

The next stage at 96 is to determine whether or not the signals have become sufficiently independent to warrant terminating the process, or whether it is necessary to continue; as before this termination condition is satisfied if ICFs of the signals have not improved significantly: if so, processing terminates; if not a respective elementary paraunitary matrix determined at each of 90, 92 and 94 is used to pre-multiply a stored product of those preceding it and the latest resulting product replaces that previously stored; the latest current signals from SBR2 94 and alignment 95 are then fed back to 90 and 91 via a feedback loop 97 for the procedure to be repeated.

In this embodiment, one or more two-channel elementary paraunitary matrices may be applied in the SBR2 stages at 90, 92 and 94 for each circulation round the loop of items 90 to 97. It is possible to apply as many elementary paraunitary matrices at these stages as one wishes, up to the number necessary to meet the termination condition for the SBR2 algorithm. It is preferred to apply only one elementary paraunitary matrix at the stages 90, 92 and 94 because it reduces the need for signal alignment at 91, 93 and 95: it uses the philosophy of applying the more important rotations first, because earlier rotations in the SBR2 process tend to give more performance gain than later equivalents.

Figure 10:
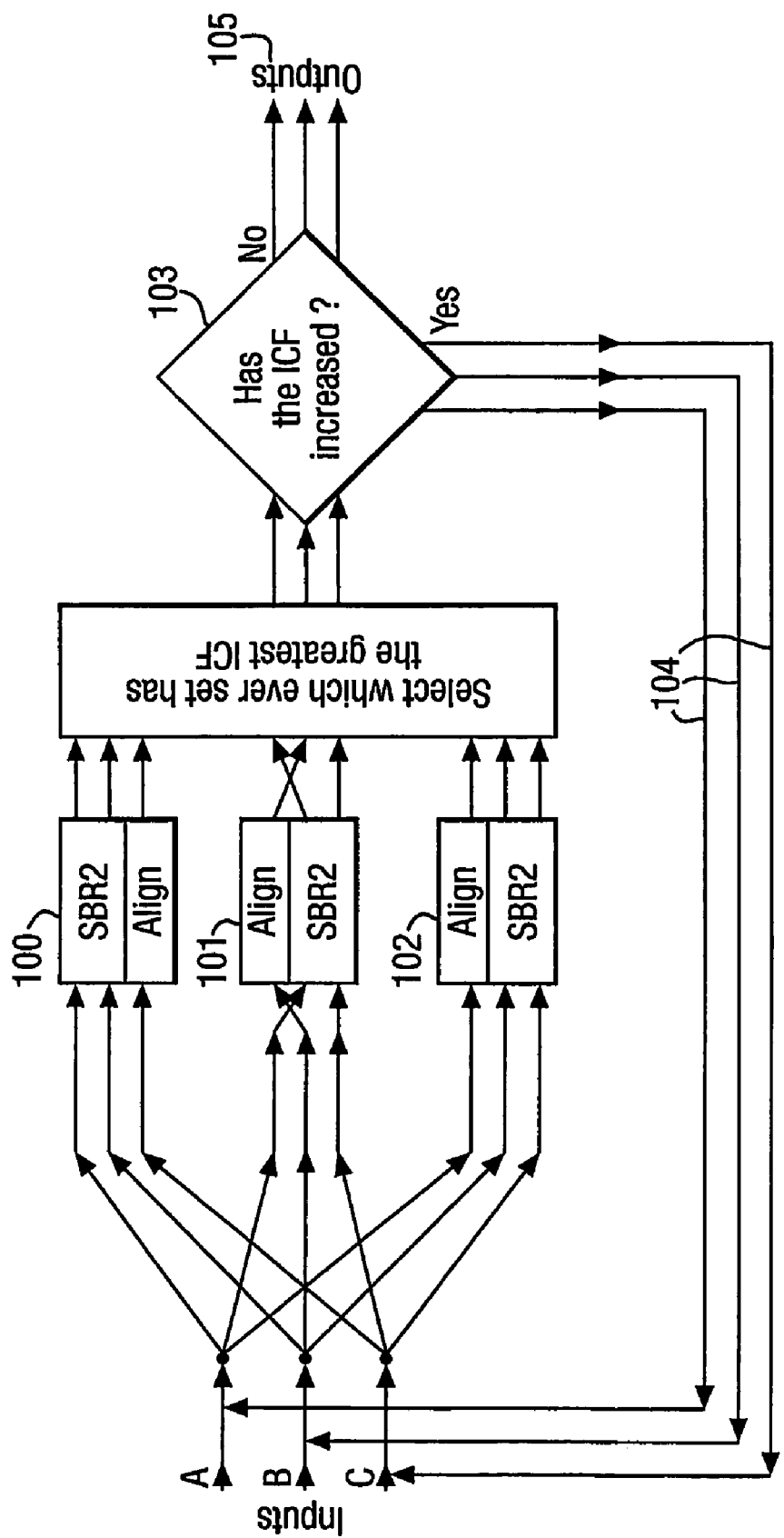

If, rather than operating on signal pairs in a fixed order, the pair that leads to the greatest ICF increase is operated on first, another approach can be produced. This approach also operates on pairs, but pair ordering is not fixed. Instead all possible pairs are considered and the one that leads to the greatest improvement in ICF is accepted. This is known as a searching process, as it searches through possible signal pairs. FIG. 10 illustrates the procedure for three signals A, B and C. The signals are replicated n(n−1)/2 times where n is the number of signals: n=3 in the present example, which coincidentally means there are three replicas of the signals. In an initial phase, using a first replica of the three signals A, B and C, at 100 signals A and B are processed with SBR2, and signal C is aligned in time with the output so produced. Here again a (or as the case may be each) two channel elementary paraunitary matrix produced by the application of SBR2 to two signal channels is extended to an n channel elementary paraunitary matrix that delays (but does not rotate) the or each remaining signal C to preserve time alignment with SBR2-processed signals A and B.

For a second replica, at 101 signals A and C are processed with SBR2, and signal B is aligned with the output. For a third replica, at 102 signals B and C are processed with SBR2 at 94, and signal A is aligned with the output. At 103, the ICFs of the three output signal groups are determined: the group with the greatest ICF is selected, and if the ICF shows an improvement over the input signals to this stage, then the operation is accepted.

As before, if the ICF of all the signals has been improved, processing continues with new, current signals and new current matrix being fed back via a loop 104 to 100, 101 and 102. If there has been no significant improvement, processing terminates and at 105 the current signals and paraunitary matrix are output.

Again the SBR2 steps 100, 101 and 102 may consist of applying a full SBR2 process of calculating a series of elementary paraunitary matrices until no improvement is obtained, or just finding one elementary paraunitary matrix. The latter case is equivalent to a restricted version of a full SBR: i.e. ignoring time alignment, the delays are restricted to only delaying one channel and the rotations to only applying a rotation to the delayed channel and one other. This reduces the size of the delay set and hence increases the speed of computation of elementary paraunitary matrices.

When dealing with a mixing problem involving more than two sensors, any algorithm has to deal with the possibility that there are fewer signals in the mixtures than there are sensors. This is dealt with in the stage in which second order independence is established, which is capable of detecting the number of signals present and reducing the number of channels to be processed in the stage which introduces higher order independence. It is done by looking at the channels produced from each time stage of the multi-channel least squares lattice predictor algorithm or filter. If one or more of these channels has much lower power that the others, it can be termed a 'noise channel' and removed from consideration. This should mean that once the multi channel least squares latter predictor algorithm has been applied the number of output channels should equal the number of input signals.

The equations and procedures given in the foregoing description can clearly be implemented by an appropriate computer program comprising program instructions recorded on an appropriate carrier medium and running on a conventional computer system. The carrier medium may be a memory, a floppy or compact or optical disc or other hardware recordal medium, or an electrical signal. Such a program is straightforward for a skilled programmer to implement from the foregoing description without requiring invention, because it involves well known computational procedures.

The equations and procedures of the invention described above have been successfully used to unmix several types of simulated signals in different mixing scenarios. The signals successfully unmixed include independent identically distributed (i.i.d) signals, filtered i.i.d signals and binary phase shift keying (BPSK) signals, as used in communications. They have been separated in a case of a mixing matrix which was paraunitary, and in a more general case of a mixing matrix which was a random polynomial matrix of known degree.

For example, when separating two BPSK signals the SBR algorithm of the invention unmixed these signals with a Bit Error Rate (BER) of less than 0.3% at 10 dB signal to noise ratio. These signals were mixed as in a prior art approach which only achieved a BER of just over 1%. Here the relevant prior art is "Blind Separation of Convolutive Mixtures, A Contrase-Based Joint Diagonalisation Approach", P. Comon, E. Moreau, L. Rota, ICA2001 San Diego, December 2001.

The invention claimed is:

1. A method of blind signal separation including obtaining input signals having second order independence with respect to one another, the method including using a computer to perform the steps of:
   a) processing the input signals with a range of signal delay parameters and a range of signal rotation parameters to determine delay and rotation parameters which implement at least one elementary paraunitary matrix and transform the input signals into output signals with improvement in a measure of independence; and
   b) designating the output signals as input signals and iterating step a) until the measure of independence ceases to be improved significantly and then designating the output signals as unmixed signals.

2. A method according to claim 1 wherein the delay and rotation parameters which transform the input signals characterize a single elementary paraunitary matrix.

3. A method according to claim 2 including producing a paraunitary matrix by cumulatively multiplying successive elementary paraunitary matrices produced by iterating step a).

4. A method according to claim 3 wherein the step of processing the input signals includes deriving a polynomial decorrelating matrix and an additional step is implemented comprising pre-multiplying this matrix by the paraunitary matrix to produce an unmixing matrix.

5. A method according to claim 2 wherein the range of signal delay parameters is a set of discrete delay vectors, and the delay and rotation parameters are determined by generating a respective version of the input signals delayed by each delay vector in the set, and for each version finding rotation parameters which at least approach producing maximisation of output signals' independence.

6. A method according to claim 5 wherein the rotation parameters which at least approach producing maximisation of output signals' independence are determined using an algorithm for independent component analysis of the kind used in instantaneous unmixing (instantaneous algorithm).

7. A method according to claim 1 involving n input signals where n is an integer greater than 2, wherein step a) comprises determining delay and rotation parameters which implement at least one elementary paraunitary matrix providing for rotation of a pair of input signals and relative delay of the or each other input signal.

8. A method according to claim 7 wherein the n input signals are associated with respective channels wherein step a) has $n(n-1)/2$ successive stages each associated with at least one respective elementary paraunitary matrix and each providing for rotation of signals associated with a respective pair of channels and provision of relative delay associated with the or each other channel, the first stage is arranged to process the input signals and the or each subsequent stage is arranged to receive signals processed in the respective preceding stage.

9. A method according to claim 1 involving n input signals where n is an integer greater than 2, wherein the range of signal delay parameters is a set of n-element delay vectors and the range of signal rotation parameters is a set of $n(n-1)/2$ angle parameters.

10. A method according to claim 1 involving a set of n input signals where n is an integer greater than 2, wherein the method incorporates using a computer to perform the further steps of:
   a) producing $n(n-1)/2$ replicas of the set of input signals,
   b) in each of said replicas selecting a respective signal pair differing to that selected in other replicas, and
   c) carrying out step a) of claim 1 for each of said replicas by determining:
      i) delay and rotation parameters which implement at least one elementary paraunitary matrix providing for rotation of the respective selected signal pair only, and
      ii) which replica when transformed by the associated at least one elementary paraunitary matrix gives rise to transformed signals corresponding to improvement in a measure of independence by at least a major part of a maximum extent obtainable over the replicas and designating these transformed signals as output signals.

11. Computer apparatus for blind signal separation comprising:
a computer system; and
a computer system memory, wherein the computer apparatus is programmed for reception of input signals having second order independence with respect to one another, the computer apparatus being also programmed to:
a) process the input signals with a range of signal delay parameters and a range of signal rotation parameters to determine delay and rotation parameters which implement at least one elementary paraunitary matrix and transform the input signals into output signals with improvement in a measure of independence; and
b) designate the output signals as input signals and iteratively process them as aforesaid at a) in this claim until the measure of independence ceases to be improved significantly and then designate the output signals as unmixed signals.

12. Computer apparatus according to claim 11 wherein the delay and rotation parameters which transform the input signals characterize a single elementary paraunitary matrix.

13. Computer apparatus according to claim 12 programmed to produce a paraunitary matrix by cumulatively multiplying successive elementary paraunitary matrices produced in iterative processing.

14. Computer apparatus according to claim 13 programmed to derive a polynomial decorrelating matrix and to pre-multiply this matrix by the paraunitary matrix to produce an unmixing matrix.

15. Computer apparatus according to claim 12 wherein the range of signal delay parameters is a set of discrete delay vectors, and the computer apparatus is programmed to determine the delay and rotation parameters by generating a respective version of the input signals delayed by each delay vector in the set, and to find for each version rotation parameters which at least approach producing maximisation of output signals' independence.

16. Computer apparatus according to claim 15 programmed to determine the rotation parameters which at least approach producing maximisation of output signals' independence using an instantaneous algorithm.

17. Computer apparatus according to claim 11 programmed to receive n input signals where n is an integer greater than 2, wherein the computer apparatus is also programmed to determine delay and rotation parameters which implement at least one elementary paraunitary matrix providing for rotation of a pair of input signals and relative delay of the or as the case may be each other input signal.

18. Computer apparatus according to claim 17 programmed to define respective channels for the n input signals wherein the computer apparatus is also programmed to process the input signals in $n(n-1)/2$ successive stages each associated with at least one respective elementary paraunitary matrix and each providing for rotation of signals associated with a respective pair of channels and provision of relative delay associated with the or as the case may be each other channel, the first such stage involving processing the input signals and the or as the case may be each subsequent stage involving processing signals resulting from processing in the respective preceding stage.

19. Computer apparatus according to claim 11 programmed to receive n input signals where n is an integer greater than 2, and wherein the range of signal delay parameters is a set of n-element delay vectors and the range of signal rotation parameters is a set of $n(n-1)/2$ angle parameters.

20. Computer apparatus according to claim 11 further programmed to receive a set of n input signals where n is an integer greater than 2, wherein the computer apparatus is also programmed to:
a) produce $n(n-1)/2$ replicas of the set of input signals,
b) in each of said replicas select a respective signal pair differing to that selected in other replicas, and
c) implement paragraph a) of claim 11 for each of said replicas as input signals and determine:
i) delay and rotation parameters which implement at least one elementary paraunitary matrix providing for rotation of the respective selected signal pair only, and
ii) which replica when transformed by the associated at least one elementary paraunitary matrix gives rise to transformed signals corresponding to improvement in a measure of independence by at least a major part of a maximum extent obtainable over the replicas and designate these transformed signals as output signals.

21. A non-transitory computer readable medium encoded with a computer program code for blind signal separation of input signals having second order independence with respect to one another, the computer program code providing instructions for controlling computer apparatus to implement the steps of:
a) processing the input signals with a range of signal delay parameters and a range of signal rotation parameters to determine delay and rotation parameters which implement at least one elementary paraunitary matrix and transform the input signals into output signals with improvement in a measure of independence; and
b) designating the output signals as input signals and iterating step a) until the measure of independence ceases to be improved significantly and then designating the output signals as unmixed signals.

22. The non-transitory computer readable medium according to claim 21 wherein the delay and rotation parameters which transform the input signals characterize a single elementary paraunitary matrix.

23. The non-transitory computer readable medium according to claim 22 providing instructions for controlling computer apparatus to implement the step of producing a paraunitary matrix by cumulatively multiplying successive elementary paraunitary matrices produced by iterating step a).

24. The non-transitory computer readable medium according to claim 23 wherein the step of processing the input signals includes deriving a polynomial decorrelating matrix and the computer program is arranged to provide for implementation of an additional step comprising pre-multiplying this matrix by the paraunitary matrix to produce an unmixing matrix.

25. The non-transitory computer readable medium according to claim 22 wherein the range of signal delay parameters is a set of discrete delay vectors, and the computer program code includes instructions for controlling computer apparatus to provide for the delay and rotation parameters to be determined by generating a respective version of the input signals delayed by each delay vector in the set, and for each version finding rotation parameters which at least approach producing maximisation of output signals' independence.

26. The non-transitory computer readable medium according to claim 25 having instructions for controlling computer apparatus provide for the rotation parameters which at least approach producing maximisation of output signals' independence to be determined using an instantaneous algorithm.

27. The non-transitory computer readable medium according to claim 21 for controlling computer apparatus to receive n input signals where n is an integer greater than 2, the computer program code having instructions for controlling computer apparatus to provide for step a) to comprise determining delay and rotation parameters which implement at least one elementary paraunitary matrix providing for rotation of a pair of input signals and relative delay of the or each other input signal.

28. The non-transitory computer readable medium according to claim 27 arranged to control computer apparatus to define respective channels for the n input signals the computer program code having instructions for controlling computer apparatus to provide for step a) to have n(n−1)/2 successive stages each associated with at least one respective elementary paraunitary matrix and each providing for rotation of signals associated with a respective pair of channels and provision of relative delay associated with the or as the case may be each other channel, the first stage being arranged to process the input signals and the or each subsequent stage being arranged to receive signals processed in the respective preceding stage.

29. The non-transitory computer readable medium according to claim 21 arranged to control computer apparatus to receive n input signals where n is an integer greater than 2, wherein the range of signal delay parameters is a set of n-element delay vectors and the range of signal rotation parameters is a set of n(n−1)/2 angle parameters.

30. The non-transitory computer readable medium according to claim 21 for controlling computer apparatus to receive a set of n input signals where n is an integer greater than 2, the computer program having instructions for controlling computer apparatus to:
  a) produce n(n−1)/2 replicas of the set of input signals,
  b) select in each replica a respective signal pair differing to that selected in other replicas, and
  c) carry out step a) of claim 21 for each said replicas as input signals by:
    i) determining delay and rotation parameters which implement at least one elementary paraunitary matrix providing for rotation of the respective selected signal pair only, and
    ii) determining which replica when transformed by the associated at least one elementary paraunitary matrix gives rise to transformed signals corresponding to improvement in a measure of independence by at least a major part of a maximum extent obtainable over the replicas and designating these transformed signals as output signals.

* * * * *